(12) United States Patent
Nakayama

(10) Patent No.: US 12,406,900 B2
(45) Date of Patent: Sep. 2, 2025

(54) SENSOR APPARATUS

(71) Applicant: SONY SEMICONDUCTOR SOLUTIONS CORPORATION, Kanagawa (JP)

(72) Inventor: Hirokazu Nakayama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 507 days.

(21) Appl. No.: 17/440,992

(22) PCT Filed: Feb. 7, 2020

(86) PCT No.: PCT/JP2020/004709
§ 371 (c)(1),
(2) Date: Sep. 20, 2021

(87) PCT Pub. No.: WO2020/202789
PCT Pub. Date: Oct. 8, 2020

(65) Prior Publication Data
US 2022/0165641 A1 May 26, 2022

(30) Foreign Application Priority Data

Mar. 29, 2019 (JP) .................................. 2019-068608

(51) Int. Cl.
*H01L 23/38* (2006.01)
*G01J 1/02* (2006.01)
(Continued)

(52) U.S. Cl.
CPC ............ *H01L 23/38* (2013.01); *G01J 1/0271* (2013.01); *G01J 1/44* (2013.01); *H10F 39/011* (2025.01);
(Continued)

(58) Field of Classification Search
CPC ............... H01L 23/38; H01L 27/14618; H01L 27/14683; H01L 31/024; H01L 23/06;
(Continued)

(56) References Cited

U.S. PATENT DOCUMENTS 6,043,982 A * 3/2000 Meissner ............... H10N 10/17
62/3.2
6,323,891 B1 * 11/2001 Kitani ................... G01T 1/2928
257/713

(Continued)

FOREIGN PATENT DOCUMENTS

CN 102692094 A 9/2012
EP 2503263 A2 9/2012
(Continued)

OTHER PUBLICATIONS

International Search Report and Written Opinion of PCT Application No. PCT/JP2020/004709, issued on Mar. 31, 2020, 09 pages of ISRWO.

*Primary Examiner* — Georgia Y Epps
*Assistant Examiner* — Monica T Taba
(74) *Attorney, Agent, or Firm* — CHIP LAW GROUP

(57) ABSTRACT

Provided is a sensor apparatus that can suppress movement of foreign matter from a Peltier element to a sensor element. The sensor apparatus includes a package substrate, a Peltier element, a circuit substrate, and a sensor element. The package substrate has a recess portion on a side of a first surface and plural terminals on a side of a second surface located on an opposite side of the first surface. The Peltier element is arranged in the recess portion. The circuit substrate is arranged on an opposite side of a bottom surface of the recess portion with the Peltier element sandwiched
(Continued)

therebetween. The sensor element is attached to an opposite side of a surface, the surface being opposed to the Peltier element.

10 Claims, 13 Drawing Sheets

(51) Int. Cl.
  *G01J 1/44* (2006.01)
  *H10F 39/00* (2025.01)
  *H10F 77/60* (2025.01)

(52) U.S. Cl.
  CPC ........... *H10F 39/804* (2025.01); *H10F 77/60* (2025.01); *G01J 2001/448* (2013.01)

(58) Field of Classification Search
  CPC ... H01L 23/04; H01L 23/10; H01L 23/49833; H01L 27/14609; H01L 27/1462; H01L 27/14636; H01L 23/13; G01J 1/0271; G01J 1/44; G01J 2001/448
  See application file for complete search history.

(56) References Cited

U.S. PATENT DOCUMENTS

| | | | |
|---|---|---|---|
| 2003/0034436 A1* | 2/2003 | Muramatsu | H01L 31/0203 257/E31.117 |
| 2003/0214031 A1* | 11/2003 | Onoue | H01S 5/0232 257/734 |
| 2004/0013152 A1* | 1/2004 | Tatoh | H01S 5/02415 372/75 |
| 2005/0127489 A1* | 6/2005 | Mallik | H01L 24/81 257/E23.101 |
| 2010/0243872 A1* | 9/2010 | Amano | H05K 1/021 250/238 |
| 2012/0240598 A1 | 9/2012 | Ueda et al. | |
| 2014/0367818 A1* | 12/2014 | Iguchi | H01L 27/14618 257/432 |
| 2020/0006617 A1* | 1/2020 | Ogawa | H01L 23/38 |
| 2022/0104344 A1* | 3/2022 | Yamada | H05K 1/11 |

FOREIGN PATENT DOCUMENTS

| | | |
|---|---|---|
| JP | 60-247385 A | 12/1985 |
| JP | H06151796 A | 5/1994 |
| JP | 2003-258221 A | 9/2003 |
| JP | 2006-054318 A | 2/2006 |
| JP | 2011044695 A | 3/2011 |
| JP | 2011238693 A | 11/2011 |
| JP | 2012-197978 A | 10/2012 |
| JP | 2014-036041 A | 2/2014 |
| KR | 10-2012-0107867 A | 10/2012 |
| WO | 2012/004923 A1 | 1/2012 |

* cited by examiner

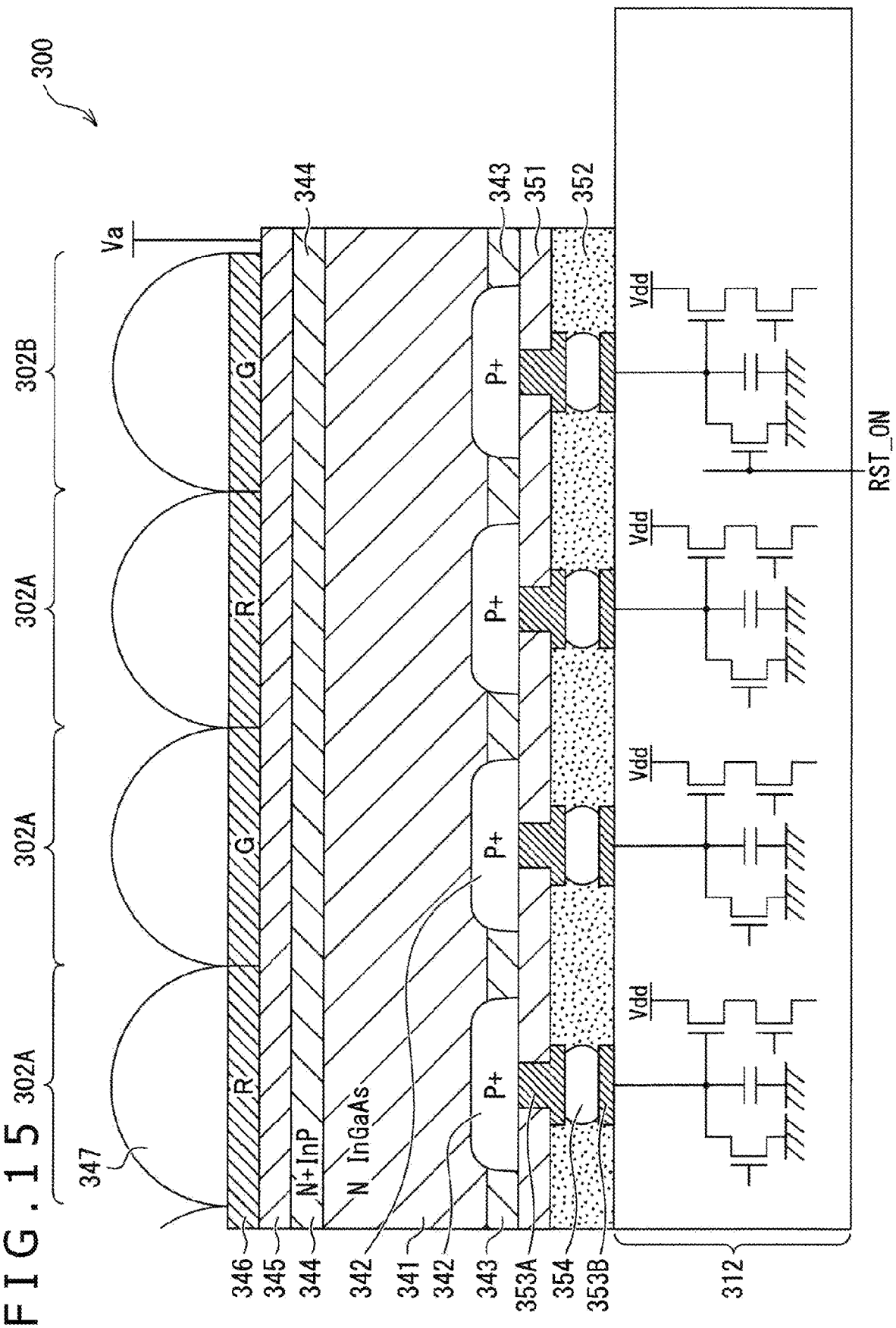

SENSOR APPARATUS

CROSS REFERENCE TO RELATED APPLICATIONS

This application is a U.S. National Phase of International Patent Application No. PCT/JP2020/004709 filed Feb. 7, 2020, which claims priority benefit of Japanese Patent Application No. JP 2019-068608 filed in the Japan Patent Office on Mar. 29, 2019. Each of the above-referenced applications is hereby incorporated herein by reference in its entirety.

TECHNICAL FIELD

The present disclosure relates to a sensor apparatus.

BACKGROUND ART

An airtight sealed package incorporating a Peltier element is known as means of cooling a solid-state imaging apparatus (refer, for example, to PTL 1).

CITATION LIST

Patent Literature

[PTL 1]
Japanese Patent Laid-Open No. 2003-258221

SUMMARY

Technical Problem

In various processes involving handling of a Peltier element such as a process for manufacturing a Peltier element, a process for transferring the Peltier element, and a process for attaching the Peltier element to a package by using solder or other means, there is a possibility that foreign matters such as dust present in a work environment may adhere inside the Peltier element or to its outer surface. There is a possibility that these foreign matters may detach themselves from the Peltier element, move inside the package, and adhere to a sensor element inside the package, after the Peltier element is arranged inside the package. If a foreign matter adheres to the sensor element, there is a possibility that the foreign matter that has adhered to the sensor element may affect operation of the sensor element.

The present disclosure has been devised in light of the foregoing, and it is an object of the present disclosure to provide a sensor apparatus that can suppress the movement of the foreign matter from the Peltier element to the sensor element.

Solution to Problem

A mode of the present disclosure is a sensor apparatus that includes a package substrate having a recess portion on a side of a first surface and plural terminals on a side of a second surface located on an opposite side of the first surface, a Peltier element arranged in the recess portion, a circuit substrate arranged on an opposite side of a bottom surface of the recess portion with the Peltier element sandwiched therebetween, and a sensor element attached to an opposite side of a surface of the circuit substrate, the surface being opposed to the Peltier element. According to this, the circuit substrate lies between the Peltier element and the sensor element, and an inner side surface of the recess portion is present beside the Peltier element, thus suppressing the movement of foreign matters from the Peltier element to the sensor element.

BRIEF DESCRIPTION OF DRAWINGS

FIG. 15 is a cross-sectional view illustrating a pixel structure of the sensor element according to embodiment 7 of the present disclosure.

DESCRIPTION OF EMBODIMENTS

A description will be given below of embodiments of the present disclosure with reference to drawings. In the representation of the drawings referred to in the following description, the same or similar portions will be denoted by the same or similar reference signs. It should be noted, however, that the drawings are schematic and that a relation between thicknesses and planar dimensions, a ratio between the thicknesses of respective layers, and the like are different from the real ones. Accordingly, the following description should be considered to determine the specific thicknesses and dimensions. Also, it is a matter of course that the drawings include the portions where the relation between the dimensions and the ratio differ from one drawing to another.

Also, a definition of directions such as upward and downward directions in the following description is merely for convenience of description and does not restrict a technical idea of the present disclosure. For example, it is a matter of course that if one observes a target by rotating it by 90 degrees, upward and downward directions are changed to leftward and rightward directions for interpretation and that if one observes the target by rotating it by 180 degrees, upward and downward directions are reversed for interpretation.

Also, in the following description, there are cases where directions are described by using wordings "X-axis direction," "Y-axis direction," and "Z-axis direction." For example, the Z-axis direction is the direction along the thickness of a sensor apparatus 100 which will be described later. The X-axis direction and the Y-axis direction are the directions orthogonal to the Z-axis direction. The X-axis direction, the Y-axis direction, and the Z-axis direction are orthogonal to one another. Also, in the following description, the term "plan view" refers to viewing from the Z-axis direction.

Embodiment 1

Figure 1:
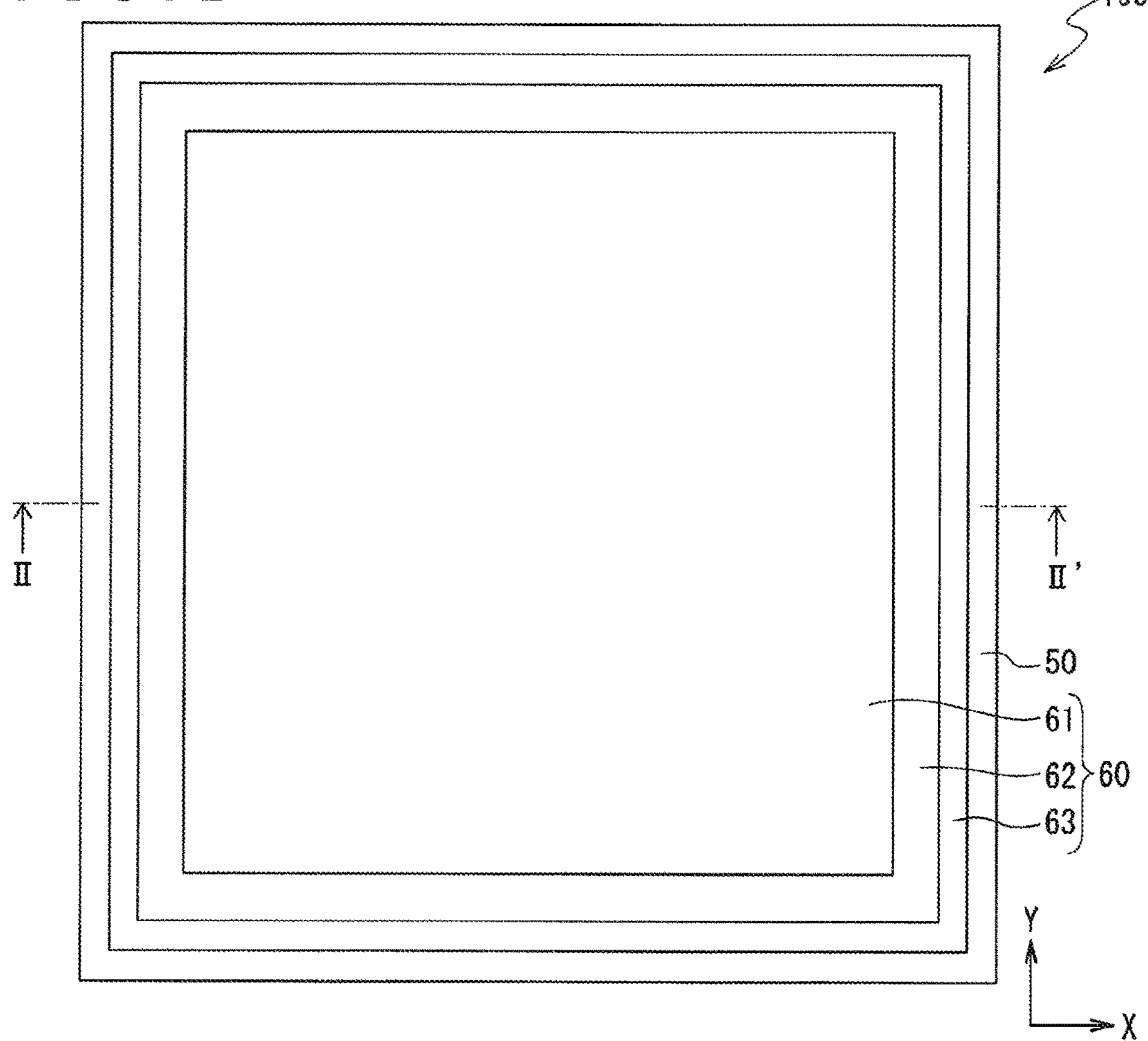
FIG. 1 is a plan view illustrating a configuration example of a sensor apparatus according to embodiment 1 of the present disclosure.
Figure 2:
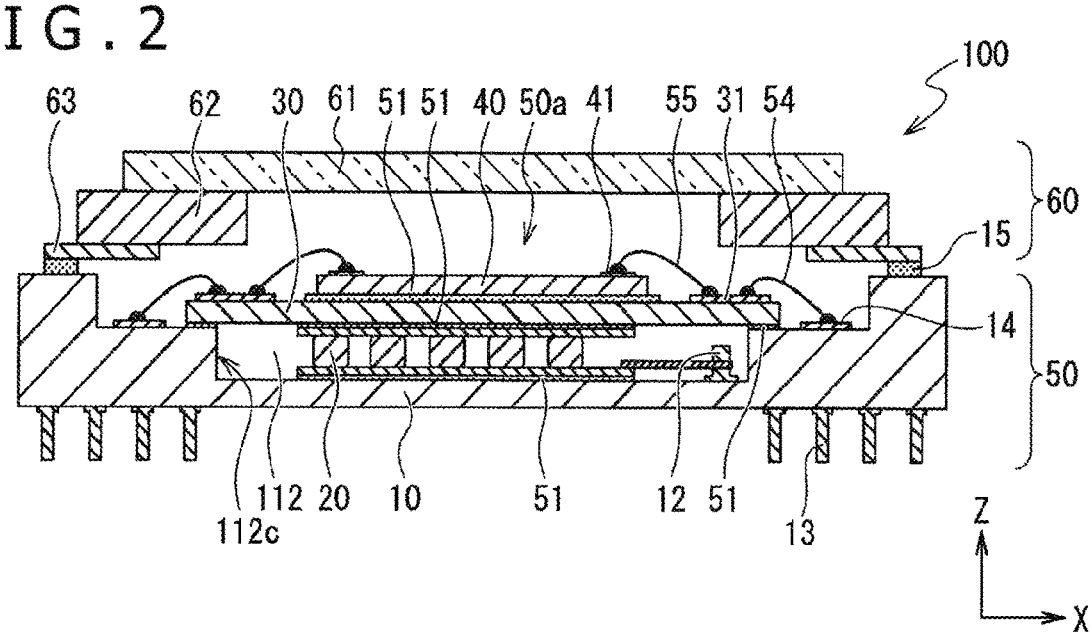
FIG. 2 is a cross-sectional view illustrating the configuration example of the sensor apparatus according to embodiment 1 of the present disclosure.

FIG. 1 is a plan view illustrating a configuration example of the sensor apparatus 100 according to embodiment 1 of the present disclosure. FIG. 2 is a cross-sectional view illustrating the configuration example of the sensor apparatus 100 according to embodiment 1 of the present disclosure. FIG. 2 illustrates a cross-section obtained by cutting FIG. 1 along an X-Z plane that passes through an II-II' line.

As illustrated in FIGS. 1 and 2, the sensor apparatus 100 includes a sensor assembly package 50 and a seal-glass-equipped lid 60 (example of a lid) attached to the side of an upper surface 50a of the sensor assembly package 50. The sensor assembly package 50 includes a package substrate 10, a Peltier element 20, a ceramic interposer substrate 30 (example of a circuit substrate), and a sensor element 40. A description will be given first of a configuration of the sensor assembly package 50.

Figure 3:
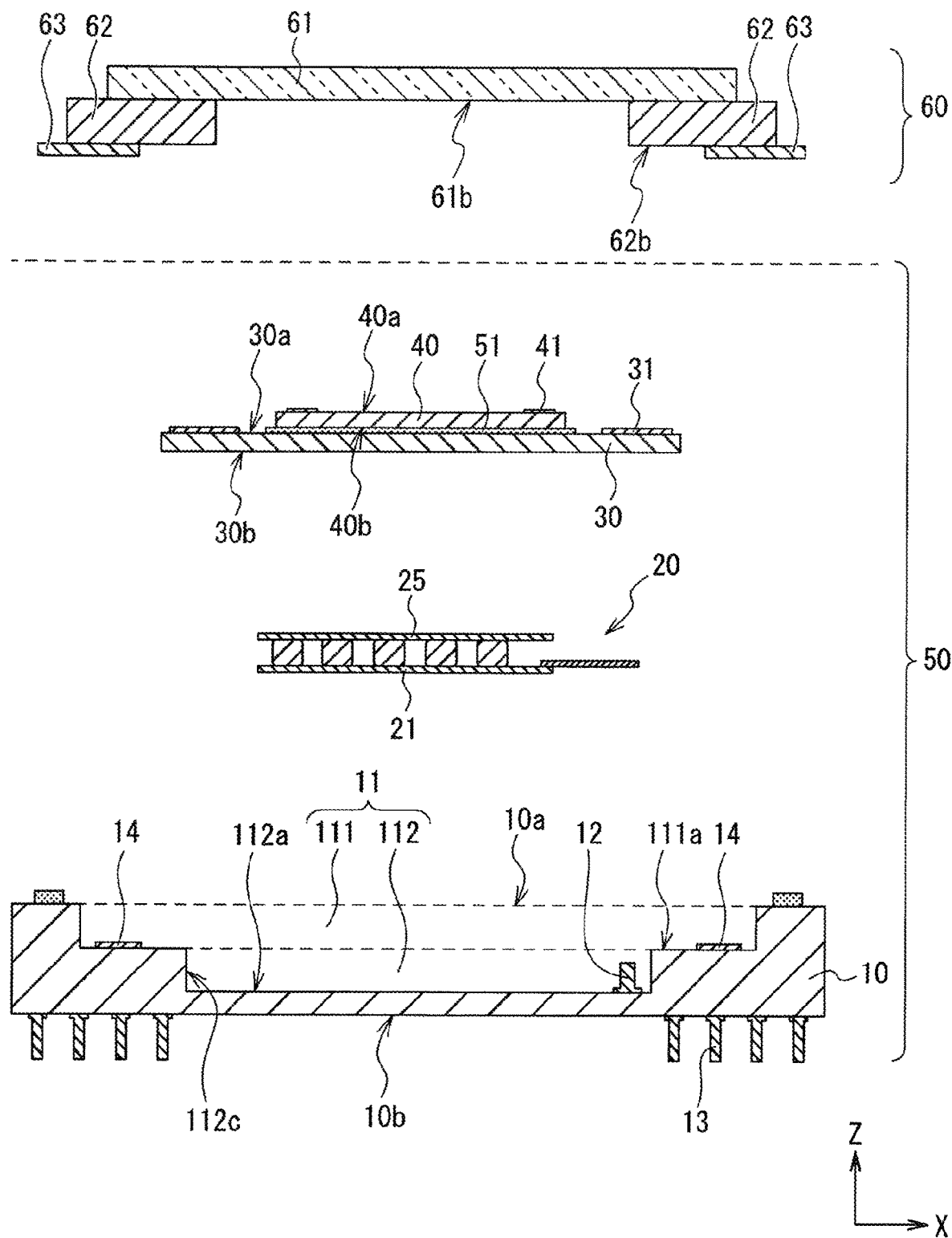
FIG. 3 is an exploded cross-sectional view illustrating the configuration example of the sensor apparatus according to embodiment 1 of the present disclosure.

FIG. 3 is an exploded cross-sectional view illustrating the configuration example of the sensor apparatus 100 according to embodiment 1 of the present disclosure. The package substrate 10 is a multi-layer substrate that includes ceramic such as alumina (aluminum oxide) and is, for example, a PGA (Pin Grid Array) substrate. As illustrated in FIG. 3, the package substrate 10 has a first surface (e.g., upper surface 10a) and a second surface (e.g., lower surface 10b) on the opposite side of the first surface. In the package substrate 10, plural wirings are provided therein in multiple layers between the upper surface 10a and the lower surface 10b. These wirings are connected to plural terminals (e.g., pin-shaped terminals 13) provided on the lower surface 10b of the package substrate 10.

Figure 4:
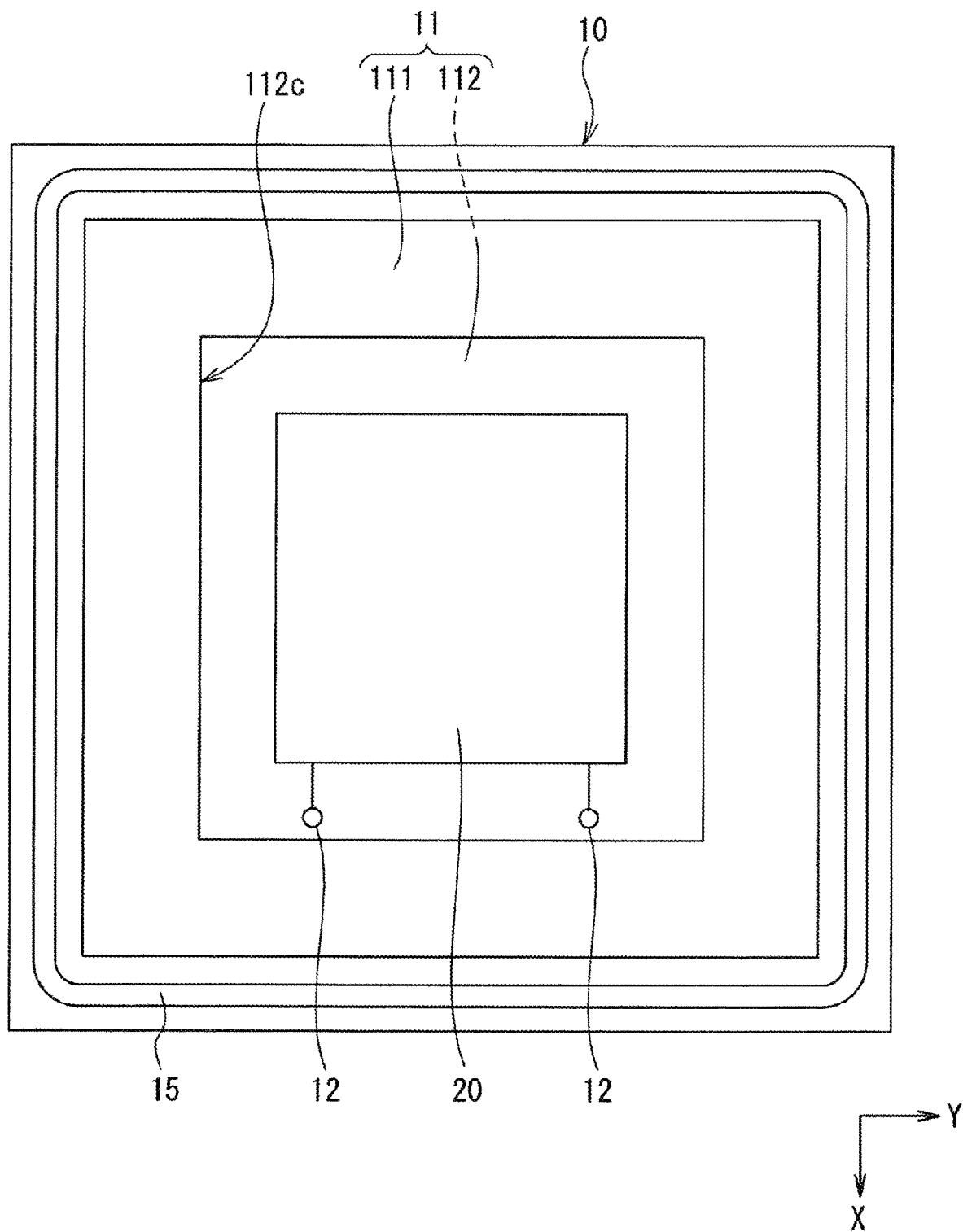
FIG. 4 is a plan view illustrating a configuration example of an upper surface side of a package substrate according to embodiment 1 of the present disclosure.

FIG. 4 is a plan view illustrating a configuration example of the side of the upper surface 10a of the package substrate 10 according to embodiment 1 of the present disclosure. As illustrated in FIGS. 3 and 4, a cavity 11 is provided on the side of the upper surface 10a of the package substrate 10. The cavity 11 has a first recess portion 111 and a second recess portion 112 provided on a bottom surface 111a of the first recess portion 111 (examples of a recess portion). The plan-view shape of the first recess portion 111 and the second recess portion 112 is, for example, rectangular. The first recess portion 111 has an opening surface that is larger in diameter than that of the second recess portion 112.

The Peltier element 20 is arranged in the second recess portion 112 and is attached to a bottom surface 112a of the second recess portion 112, for example, via an adhesive 51 (refer to FIG. 2). An upper surface of the Peltier element 20 arranged in the second recess portion 112 (e.g., upper surface 25a of a second ceramic substrate 25 which will be described later) is at the same height or approximately at the same height as that of the bottom surface 111a of the first recess portion 111.

Pin-shaped terminals 12 for connection to lead wires of the Peltier element 20 are provided on the bottom surface 112a of the second recess portion 112. The two pin-shaped terminals 12 are provided. One of the two pin-shaped terminals 12 is connected to a positive lead wire of the Peltier element 20, and the other is connected to a negative lead wire of the Peltier element 20.

As illustrated in FIGS. 2 to 4, a seal ring 15 is provided on the side of the upper surface 10a of a perimeter portion of the package substrate 10. The seal ring 15 is continuously provided in such a manner as to surround the cavity 11 of the package substrate 10 in plan view. The seal ring 15 is a part that is joined to a metallic portion 63, which will be described later, of the seal-glass-equipped lid 60. The seal ring 15 is, for example, iron (Fe)-nickel (Ni)-cobalt (Co) alloy (what is called Kovar) and is surface-treated with Ni and gold (Au) plating or the like.

Figure 5:
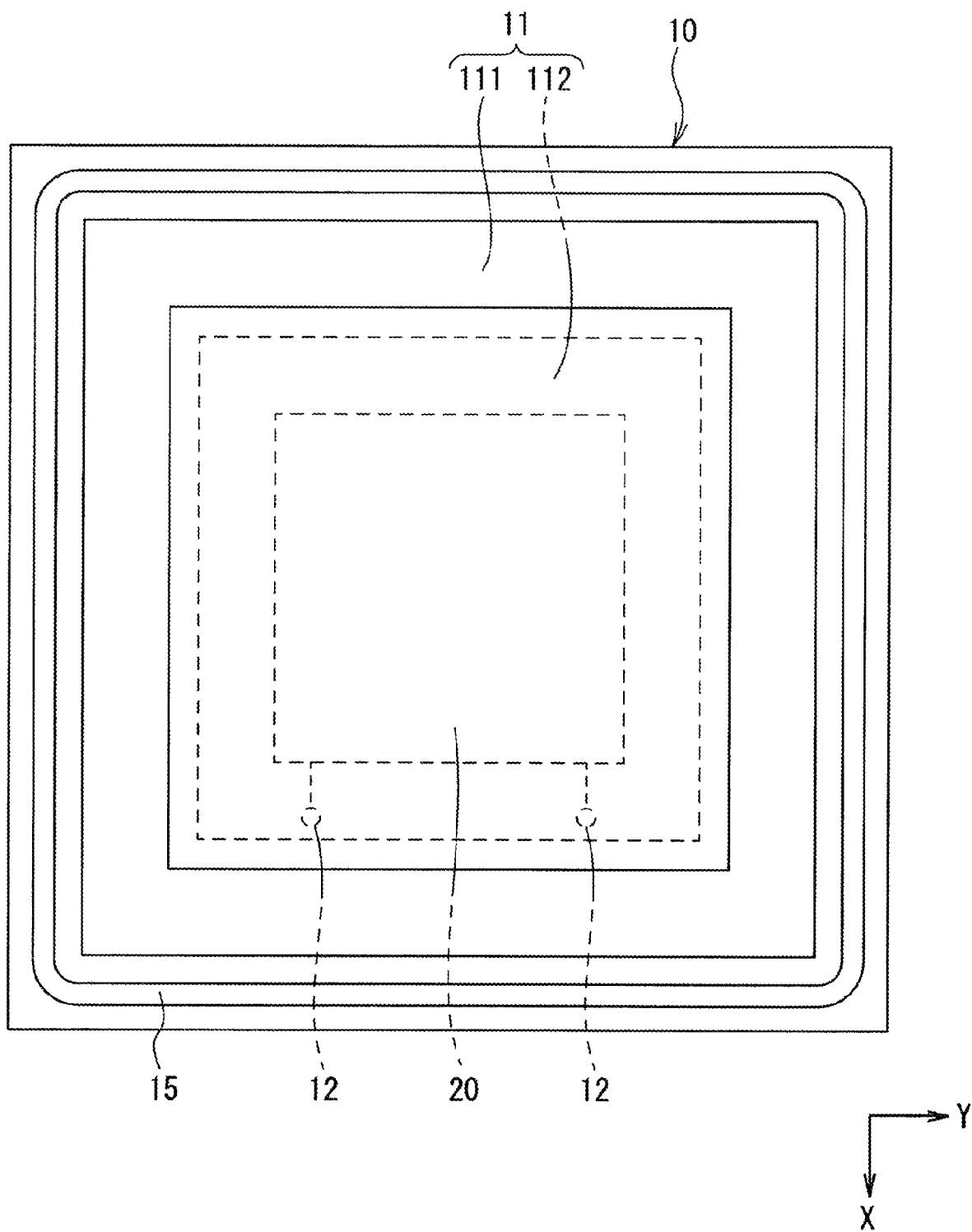
FIG. 5 is a plan view illustrating a positional relation between the package substrate and a ceramic interposer substrate according to embodiment 1 of the present disclosure.

FIG. 5 is a plan view illustrating a positional relation between the package substrate 10 and the ceramic interposer substrate 30 according to embodiment 1 of the present disclosure. As illustrated in FIG. 2, the side of a lower surface 30b of the ceramic interposer substrate 30 is attached to the bottom surface 111a of the first recess portion 111 and the Peltier element 20 via the adhesive 51. As illustrated in FIGS. 2 and 5, the ceramic interposer substrate 30 is arranged in such a manner as to entirely cover an opening surface of the second recess portion 112.

Plural bonding pads 14 are provided in a region exposed from under the ceramic interposer substrate 30, the region being the bottom surface 111a of the first recess portion 111. Also, plural bonding pads 31 are provided on the side of the lower surface 30b of the ceramic interposer substrate 30. At least some of the plural bonding pads 31 are connected to the bonding pads 14 via wires 54. Also, at least some of the plural bonding pads 31 are connected to bonding pads 41 of the sensor element 40 via wires 55. Alternatively, both the wires 54 and 55 may be connected to the single bonding pad 31. The wires 54 and 55 are, for example, gold wires.

The sensor element 40 is, for example, a CMOS (Complementary Metal Oxide Semiconductor) image sensor or a CCD (Charge Coupled Device) image sensor. A photoelectric conversion layer of the CMOS image sensor or the CCD (Charge Coupled Device) image sensor includes, for example, silicon (Si). Light detected by the sensor element 40 is not limited to visible light and may be, for example, infrared rays or ultraviolet rays. The bonding pads 41 are provided in a perimeter region on the side of the upper surface 40a of the sensor element 40. The side of a lower surface 40b of the sensor element 40 is attached to the side of the lower surface 30b of the ceramic interposer substrate 30 via the adhesive 51.

Figure 6:
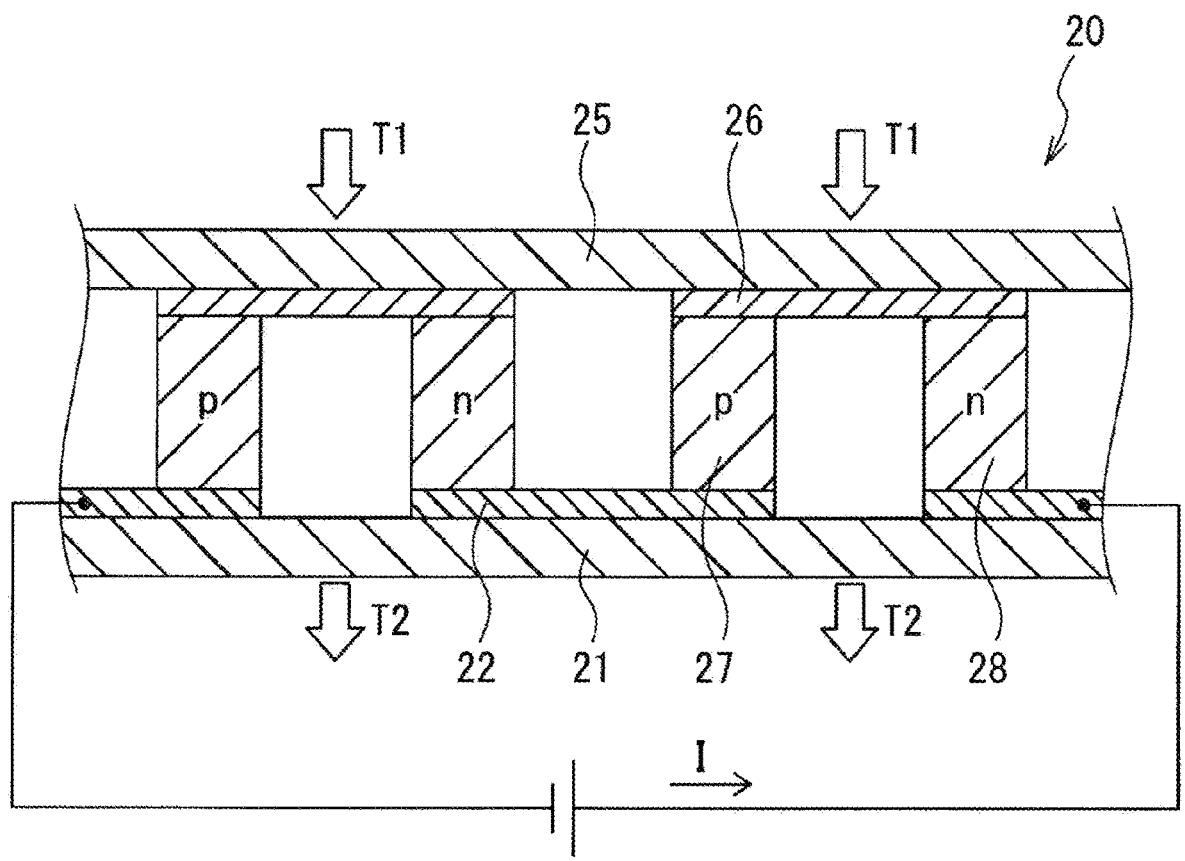
FIG. 6 is a cross-sectional view illustrating a configuration example of a Peltier element according to embodiment 1 of the present disclosure.

FIG. 6 is a cross-sectional view illustrating a configuration example of the Peltier element 20 according to embodiment 1 of the present disclosure. As illustrated in FIG. 6, the Peltier element 20 has a first ceramic substrate 21, a first copper electrode 22, a second ceramic substrate 25, a second copper electrode 26, a P-type thermoelectric semiconductor 27, and an N-type thermoelectric semiconductor 28. The first copper electrode 22 is provided on the first ceramic substrate 21. The second ceramic substrate 25 is opposed to the first ceramic substrate 21. The second copper electrode 26 is provided on the second ceramic substrate 25. The P-type thermoelectric semiconductor 27 and the N-type thermoelectric semiconductor 28 are each arranged between the first ceramic substrate 21 and the second ceramic substrate 25. The P-type thermoelectric semiconductor 27 and the N-type thermoelectric semiconductor 28 each have its one end connected to the first copper electrode 22 and its other end connected to the second copper electrode 26. The P-type thermoelectric semiconductor 27 and the N-type thermoelectric semiconductor 28 are connected alternately and in series via the first copper electrode 22 and the second copper electrode 26.

As illustrated in FIG. 6, in the Peltier element 20, when a direct current is passed from the N-type thermoelectric semiconductor 28, the second ceramic substrate 25 absorbs heat T1 (heat absorption), and the first ceramic substrate 21 radiates heat T2 (heat radiation). The second ceramic substrate 25 is attached to the ceramic interposer substrate 30 via the adhesive 51, and the first ceramic substrate 21 is attached to the package substrate 10 via the adhesive 51. This makes it possible for the Peltier element 20 to dissipate heat generated by the sensor element 40 or the like from the ceramic interposer substrate 30 to the package substrate 10.

A description will be given next of a configuration of the sensor assembly package 50. As illustrated in FIGS. 1 to 3, the seal-glass-equipped lid 60 has a seal glass 61, a ceramic frame 62, and the metallic portion 63. The ceramic frame 62 is provided on the side of a lower surface 61b of a perimeter portion of the seal glass 61. The metallic portion 63 is provided on the side of a lower surface 62b of the ceramic frame 62. The seal glass 61 and the ceramic frame 62 are joined together, for example, with low melting point glass. The ceramic frame 62 and the metallic portion 63 are joined together, for example, with an Ag—Cu wax material or the like.

The metallic portion 63 is a part joined to the seal ring 15 of the package substrate 10, for example, by seam welding or other means. The metallic portion 63 includes the same material as that of the seal ring 15, one example of which is iron (Fe)-nickel (Ni)-cobalt (Co) alloy (what is called Kovar) and is surface-treated with Ni and gold (Au) plating or the like. The seal-glass-equipped lid 60 is joined to the side of the upper surface 50a of the sensor assembly package 50, and the side of the upper surface 50a of the sensor assembly package 50 is sealed airtight.

A description will be given next of a manufacturing method of the sensor apparatus 100. It should be noted that various apparatuses such as an application apparatus for applying the adhesive 51, an attachment apparatus for attaching the Peltier element 20, the ceramic interposer substrate 30, or the seal-glass-equipped lid 60, a wire bonding apparatus, and a seam welding apparatus are used to manufacture the sensor apparatus 100. In the embodiments of the present disclosure, these apparatuses will be collectively referred to as manufacturing apparatuses. Also, at least some of tasks performed by the manufacturing apparatuses may be performed by workers.

Figure 7A:
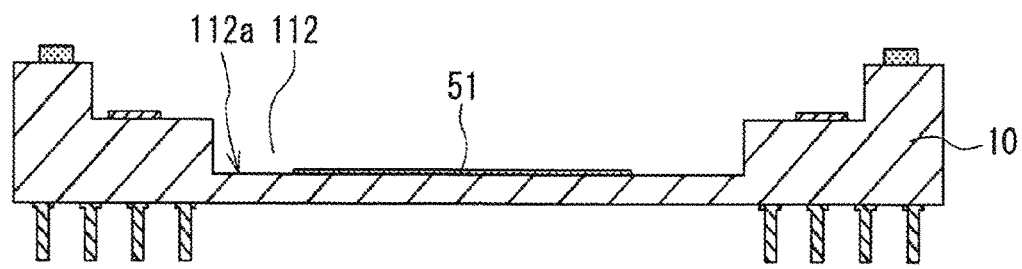
FIG. 7A is a cross-sectional view illustrating a manufacturing method of the sensor apparatus according to embodiment 1 of the present disclosure.
Figure 7B:
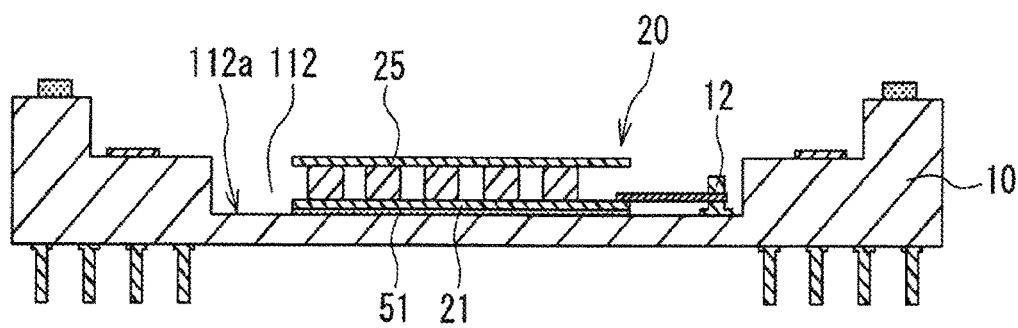
FIG. 7B is a cross-sectional view illustrating the manufacturing method of the sensor apparatus according to embodiment 1 of the present disclosure.

FIGS. 7A, 7B, 7C, 7D, and 7E are cross-sectional views illustrating the manufacturing method of the sensor apparatus 100 according to embodiment 1 of the present disclosure. First, as illustrated in FIG. 7A, the manufacturing apparatus applies the adhesive 51 to the bottom surface 112a of the second recess portion 112 of the package substrate 10. Next, as illustrated in FIG. 7B, the manufacturing apparatus attaches the Peltier element 20 to the bottom surface 112a of the second recess portion 112 via the adhesive 51. Also, before or after this bonding, the manufacturing apparatus wraps the lead wires of the Peltier element 20 around the pin-shaped terminals 12 and solders the lead wires. This allows the Peltier element 20 to be electrically connected to the package substrate 10.

Figure 7C:
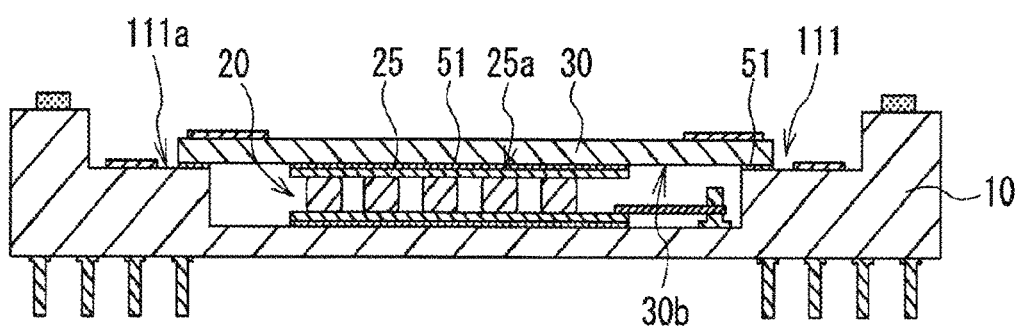
FIG. 7C is a cross-sectional view illustrating the manufacturing method of the sensor apparatus according to embodiment 1 of the present disclosure.

Next, as illustrated in FIG. 7C, the manufacturing apparatus attaches the ceramic interposer substrate 30 to the Peltier element 20 and the package substrate 10. For example, the manufacturing apparatus applies the adhesive 51 to the bottom surface 111a of the first recess portion 111 and to the upper surface 25a of the second ceramic substrate 25 which is at the same height as that of the bottom surface 111a. Then, the manufacturing apparatus attaches the lower surface 30b of the ceramic interposer substrate 30 to the bottom surface 111a of the first recess portion 111 and to the upper surface 25a of the second ceramic substrate 25 via the adhesive 51. This allows the opening surface of the second recess portion 112 to be entirely covered with the ceramic interposer substrate 30. A path that runs through a space between the Peltier element 20 and the sensor element 40 is closed by the ceramic interposer substrate 30 and an inner side surface 112c of the second recess portion 112, thereby separating the space around the Peltier element 20 from the space around the sensor element 40.

Figure 7D:
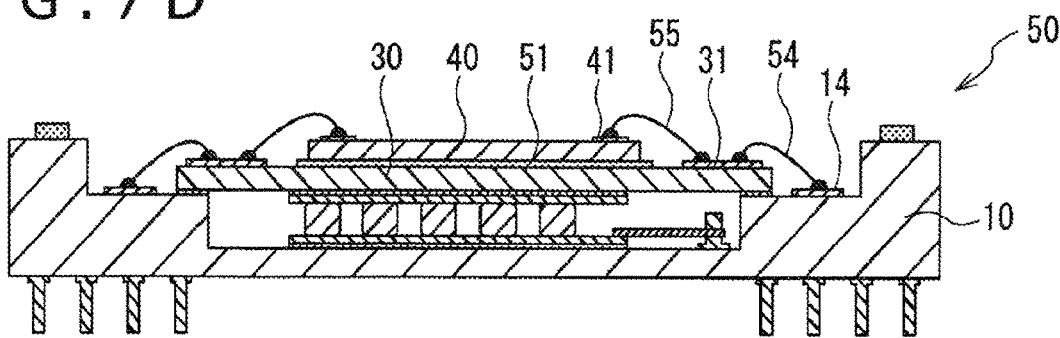
FIG. 7D is a cross-sectional view illustrating the manufacturing method of the sensor apparatus according to embodiment 1 of the present disclosure.

Next, as illustrated in FIG. 7D, the manufacturing apparatus attaches the sensor element 40 to an upper surface 30a of the ceramic interposer substrate 30 via the adhesive 51. Then, the manufacturing apparatus electrically connects the bonding pads 41 of the sensor element 40 and the bonding pads 31 of the ceramic interposer substrate 30 via the wires 55. Also, the manufacturing apparatus electrically connects the bonding pads 31 of the ceramic interposer substrate 30 and the bonding pads 14 of the package substrate 10 via the wires 55. This completes the sensor assembly package 50.

Figure 7E:
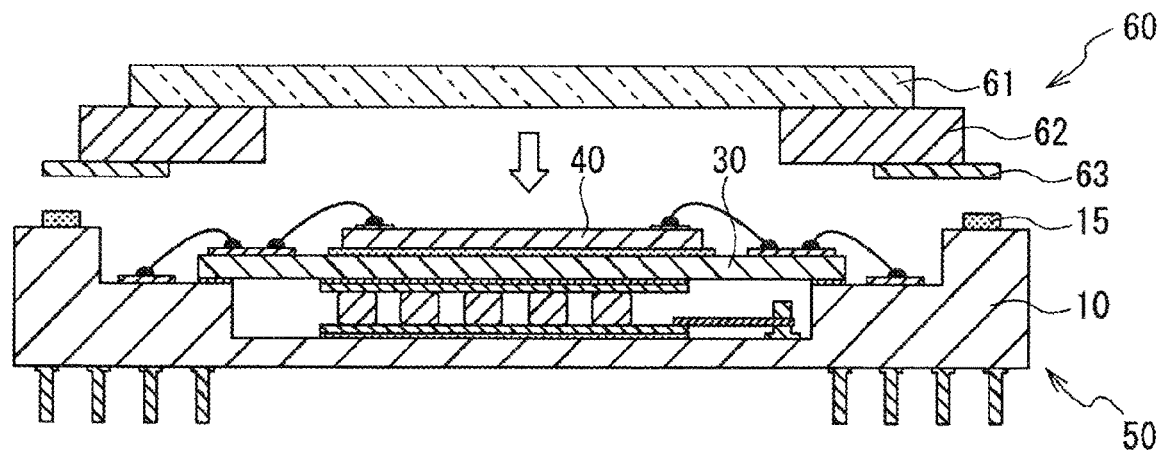
FIG. 7E is a cross-sectional view illustrating the manufacturing method of the sensor apparatus according to embodiment 1 of the present disclosure.

Next, as illustrated in FIG. 7E, with the seal-glass-equipped lid 60 and the sensor assembly package 50 aligned with each other, the manufacturing apparatus attaches the seal-glass-equipped lid 60 to the sensor assembly package 50, for example, by seam welding or other means. This allows the space between the seal-glass-equipped lid 60 and the sensor assembly package (hereinafter referred to as a "package interior") to be sealed airtight.

Seam welding is a type of resistance welding and is a continuous welding method that uses a roller electrode and achieves welding by rotating the electrode while applying a pressure and passing a current. The seal ring 15 of the sensor assembly package 50 and the metallic portion 63 of the seal-glass-equipped lid 60 are joined by this method. By placing the inside of a chamber provided in the seam welding apparatus into a dry air, nitrogen, vacuum, or other atmosphere, this process can also keep the atmosphere inside the package in a dry air, nitrogen, or vacuum atmosphere.

As described above, the sensor apparatus 100 according to embodiment 1 of the present disclosure includes the package substrate 10, the Peltier element 20, the ceramic interposer substrate 30, and the sensor element 40. The package substrate 10 has the second recess portion 112 on the side of the upper surface 10a and has the plural pin-shaped terminals 13 on the side of the lower surface 10b located on the opposite side of the upper surface 10a. The Peltier element 20 is arranged in the second recess portion 112. The ceramic interposer substrate 30 is arranged on the opposite side of the bottom surface 112a of the second recess portion 112 with the Peltier element 20 sandwiched therebetween. In the ceramic interposer substrate 30, the sensor element 40 is attached to the opposite side of the surface opposed to the Peltier element 20.

According to this, the ceramic interposer substrate 30 lies between the Peltier element 20 and the sensor element 40, and the inner side surface 112c of the second recess portion 112 is present beside the Peltier element 20. Also, there is no gap S between the inner side surface 112c of the second recess portion 112 and the ceramic interposer substrate 30. The space around the Peltier element 20 is separated from the space around the sensor element 40 by the inner side surface 112c of the second recess portion 112 and the ceramic interposer substrate 30, thus preventing the movement of foreign matters from the Peltier element 20 to the sensor element 40. This makes it possible, even in a case where foreign matters such as dust adhere inside the Peltier element 20 or to its outer surface, to reduce the number of foreign matters that adhere to the sensor element 40 and to decrease the possibility that the operation of the sensor element 40 is affected due to foreign matters.

Also, the sensor apparatus 100 further includes the seal-glass-equipped lid 60 that is attached to the package substrate 10 and covers the ceramic interposer substrate 30 and the sensor element 40. The space between the seal-glass-equipped lid 60 and the package substrate 10 is sealed airtight. According to this, it is possible to prevent intrusion of foreign matters from outside into the sensor apparatus 100. It is possible to further reduce the number of foreign matters that adhere to the sensor element 40.

Also, the seal-glass-equipped lid 60 is attached to the package substrate 10 by seam welding. According to this, it is possible to improve reliability of airtight seal inside the package.

Also, the package substrate 10 is a multi-layer substrate that includes ceramic. The seal-glass-equipped lid 60 includes the seal glass 61, the ceramic frame 62, and the metallic portion 63. Neither of the package substrate 10 and the seal-glass-equipped lid 60 included in the package of the sensor apparatus 100 includes resin. This makes it possible to prevent the intrusion of moisture and the like from outside into the sensor apparatus 100 with high reliability.

Embodiment 2

In above embodiment 1, it has been described that the ceramic interposer substrate 30 is arranged in such a manner as to entirely cover the opening surface of the second recess portion 112 and that the space around the Peltier element 20 is separated from the space around the sensor element 40 by the ceramic interposer substrate 30 and the inner side surface 112c of the second recess portion 112. However, the embodiments of the present disclosure are not limited thereto. For example, the ceramic interposer substrate 30 may be arranged in such a manner as to partially cover the opening surface of the second recess portion 112. The Peltier element 20 and the sensor element 40 may not be completely spatially separated.

Figure 8:
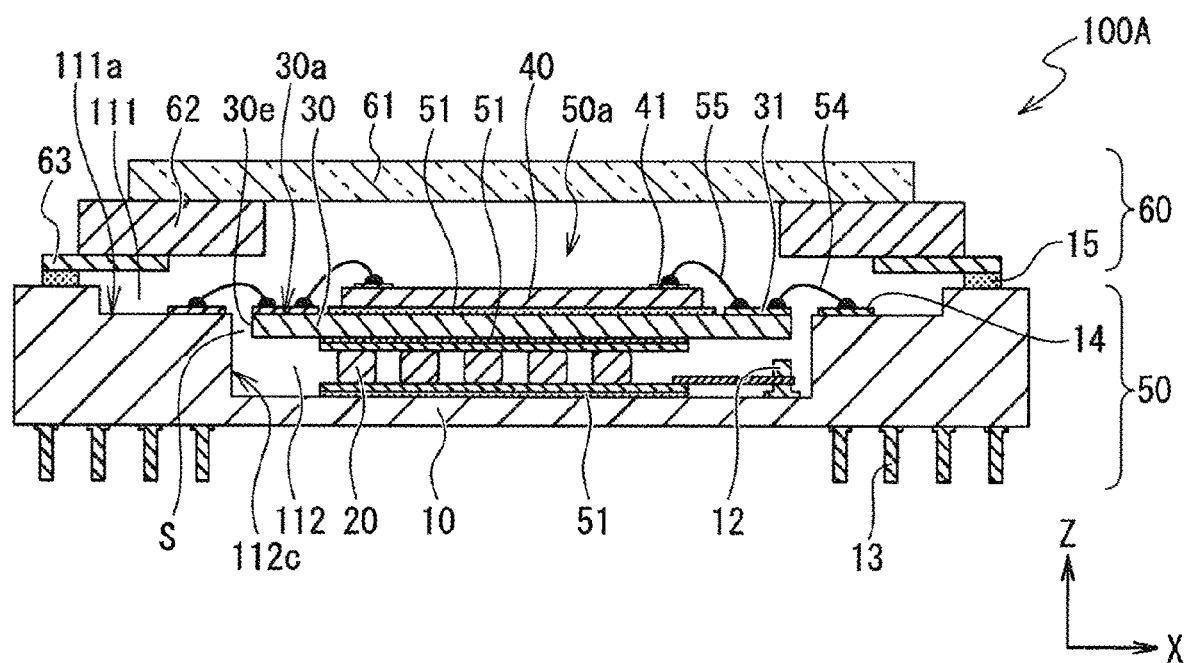
FIG. 8 is a cross-sectional view illustrating a configuration example of a sensor apparatus according to embodiment 2 of the present disclosure.

FIG. 8 is a cross-sectional view illustrating a configuration example of a sensor apparatus 100A according to embodiment 2 of the present disclosure. As illustrated in FIG. 8, in the sensor apparatus 100A, the ceramic interposer substrate 30 partially, and not completely, covers the opening surface of the second recess portion 112. A plan-view size of the ceramic interposer substrate 30 is approximately equal to or slightly smaller than that of the opening surface of the second recess portion 112. Because of this structure, the gap S is present between the inner side surface 112c of the second recess portion 112 and an edge portion 30e of the ceramic interposer substrate 30. There is a possibility that foreign matters may pass through the gap S.

However, the ceramic interposer substrate 30 protrudes more outward than the Peltier element 20, and the path that runs through the space between the Peltier element 20 and the sensor element 40 detours the edge portion 30e of the ceramic interposer substrate 30. This lengthens a distance of the path that runs through the above space. Also, the inner side surface 112c of the second recess portion 112 is present beside the Peltier element 20. The inner side surface 112c of the second recess portion 112 is in proximity to the edge portion 30e of the ceramic interposer substrate 30, and the gap S is narrower.

As described above, the path that runs through the above space has a long distance, and further, the gap S is narrower, thus suppressing the movement of foreign matters from the Peltier element 20 to the sensor element 40. This makes it possible, even in the case where foreign matters such as dust adhere inside the Peltier element 20 or to its outer surface, to reduce the number of foreign matters that adhere to the sensor element 40 and to decrease the possibility that the operation of the sensor element 40 is affected due to foreign matters.

Also, it is preferred that, in the sensor apparatus 100A, the upper surface 30a of the ceramic interposer substrate 30 should be at the same or approximately at the same height as that of the bottom surface 111a of the first recess portion 111, as illustrated in FIG. 8. This can not only reduce the above gap S but also eliminate a difference in level between the bonding pads 14 and 31, thus making it possible to shorten the length of the wires 54 that electrically connect the bonding pads 14 and 31. As a result, it becomes possible to reduce an amount of Au used that is included in the wires 54, thus contributing to reduced manufacturing cost of the sensor apparatus 100A.

Embodiment 3

In above embodiment 1, it has been described that the space around the Peltier element 20 is separated from the space around the sensor element 40 by the ceramic interposer substrate 30 and the inner side surface 112c of the second recess portion 112. In the embodiments of the present disclosure, however, the structure for separating the space between the Peltier element 20 and the sensor element 40 is not limited to that described above.

Figure 9:
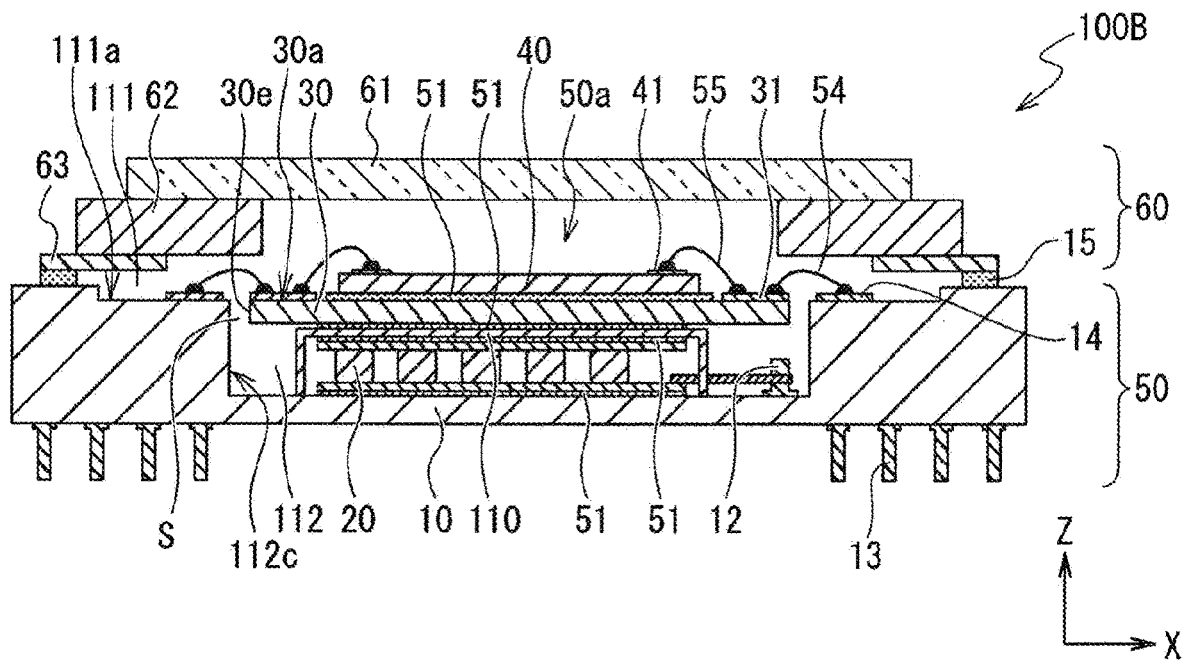
FIG. 9 is a cross-sectional view illustrating a configuration example of a sensor apparatus according to embodiment 3 of the present disclosure.

FIG. 9 is a cross-sectional view illustrating a configuration example of a sensor apparatus 100B according to embodiment 3 of the present disclosure. As illustrated in FIG. 9, the sensor apparatus 100B includes a metallic casing 110 that is arranged in the second recess portion 112 and that accommodates the Peltier element 20 therein. The casing 110 is, for example, a cuboid and shaped in such a manner that the side of a surface opposed to the bottom surface 112a of the second recess portion 112 is open. The inside of the casing 110 is fastened to the Peltier element 20 via the adhesive 51, and the outside of the casing 110 is fastened to the ceramic interposer substrate 30 via the adhesive 51. The space around the Peltier element 20 is separated from the space around the sensor element 40 by the casing 110.

In such a configuration, the casing 110 prevents the movement of foreign matters from the Peltier element 20 to the sensor element 40. This makes it possible, even in the case where foreign matters such as dust adhere inside the Peltier element 20 or to its outer surface, to reduce the number of foreign matters that adhere to the sensor element 40 and to decrease the possibility that the operation of the sensor element 40 is affected due to foreign matters.

Also, the casing 110 is metallic and covers the Peltier element 20. This allows the casing 110 to shield the Peltier element 20, thus suppressing electromagnetic waves (noise) generated by the Peltier element 20 from entering the sensor element 40.

A description will be given of a process for attaching the casing 110. For example, after the Peltier element 20 is attached to the bottom surface 112a of the second recess portion 112 and the lead wires of the Peltier element 20 are electrically connected to the pin-shaped terminals 12, the manufacturing apparatus applies the adhesive 51 to the upper surface of the Peltier element 20 and places the casing 110 over the Peltier element 20 to which the adhesive 51 has been applied. This allows the casing 110 to be fastened to the upper surface of the Peltier element 20 via the adhesive 51. Thereafter, the manufacturing apparatus applies the adhesive 51 to an upper surface of the casing 110 and attaches the ceramic interposer substrate 30 to the upper surface of the casing 110 to which the adhesive 51 has been applied. The subsequent processes are the same as in embodiment 1.

Embodiment 4

In the embodiments of the present disclosure, the structure for separating the space between the Peltier element 20 and the sensor element 40 may be realized by a component other than the casing.

Figure 10:
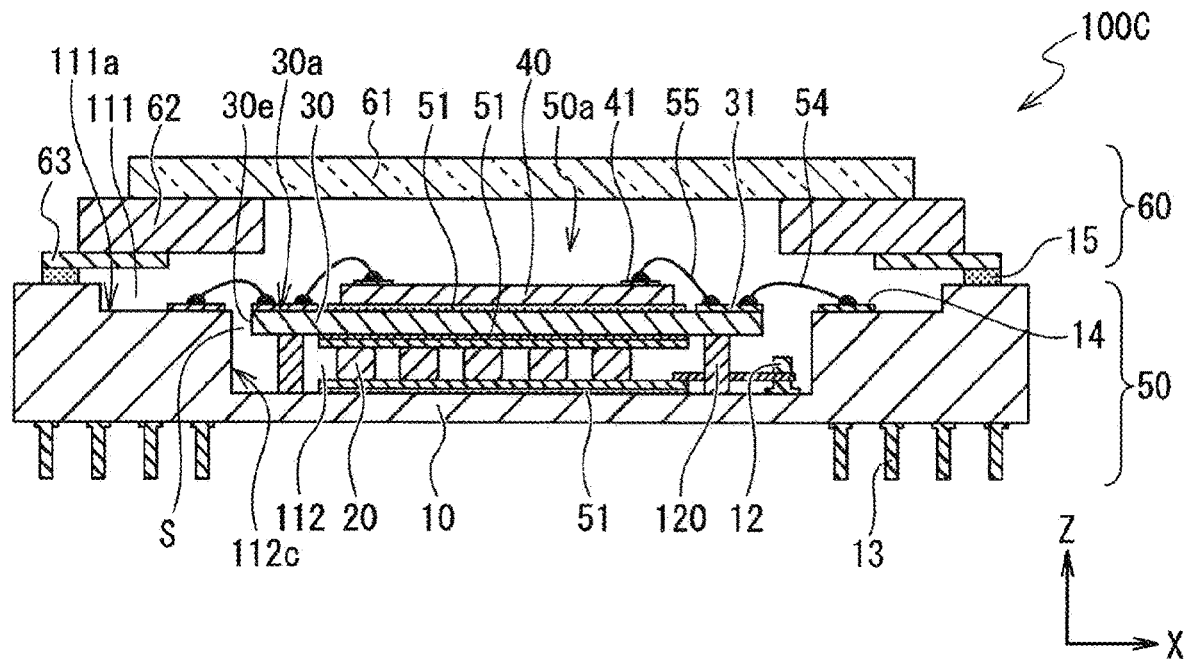
FIG. 10 is a cross-sectional view illustrating a configuration example of a sensor apparatus according to embodiment 4 of the present disclosure.

FIG. 10 is a cross-sectional view illustrating a configuration example of a sensor apparatus 100C according to embodiment 4 of the present disclosure. As illustrated in FIG. 10, the sensor apparatus 100C includes a wall member 120 that is sandwiched between the bottom surface 112a of the second recess portion 112 and the ceramic interposer substrate 30 and laterally surrounds the Peltier element 20. For example, the wall member 120 includes resin. The plan-view shape of the wall member 120 is a frame, and the Peltier element 20 is arranged inside the frame. The space around the Peltier element 20 is separated from the space around the sensor element 40 by the ceramic interposer substrate 30 and the wall member 120.

In such a configuration, the ceramic interposer substrate 30 and the wall member 120 prevent the movement of foreign matters from the Peltier element 20 to the sensor element 40. This makes it possible, even in the case where foreign matters such as dust adhere inside the Peltier element 20 or to its outer surface, to reduce the number of foreign matters that adhere to the sensor element 40 and to decrease the possibility that the operation of the sensor element 40 is affected due to foreign matters.

It should be noted that, in the embodiments of the present disclosure, the material included in the wall member 120 is not limited to resin and may be a metal. In a case where the wall member 120 includes a metal, the wall member 120 can laterally shield the Peltier element 20, thus reducing noise that propagates horizontally (e.g., direction parallel to the X-Y plane).

A description will be given of a process for forming the wall member 120. For example, after the Peltier element 20 is attached to the bottom surface 112a of the second recess portion 112 and the lead wires of the Peltier element 20 are electrically connected to the pin-shaped terminals 12, the manufacturing apparatus forms the wall member 120 on the bottom surface 112a in such a manner as to surround the periphery of the Peltier element 20. Although the wall member 120 may be formed in any manner, an example of forming method is to attach the wall member 120, which is formed in advance by resin molding, to the bottom surface 112a via the adhesive (not illustrated). Thereafter, the manufacturing apparatus attaches the ceramic interposer substrate 30 to the upper surface of the Peltier element 20 via the adhesive 51. The adhesive 51 may or may not be present between the wall member 120 and the ceramic interposer substrate 30. The subsequent processes are the same as in embodiment 1.

Embodiment 5

In the embodiments of the present disclosure, the structure for reducing noise may be provided on the ceramic interposer substrate 30.

Figure 11:
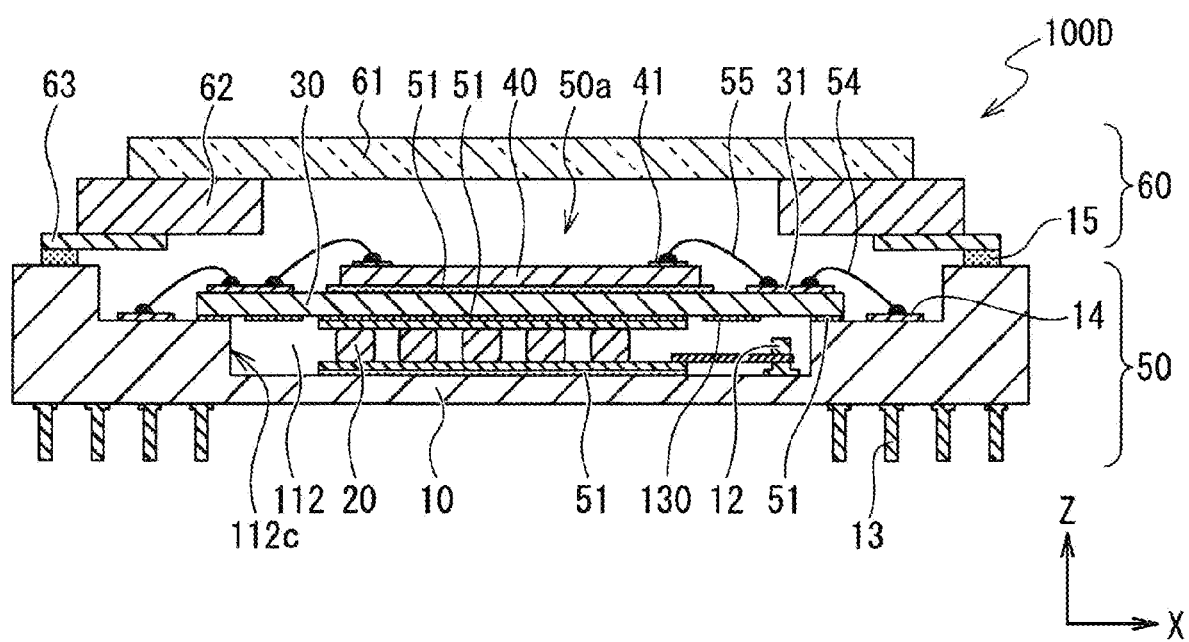
FIG. 11 is a cross-sectional view illustrating a configuration example of a sensor apparatus according to embodiment 5 of the present disclosure.

FIG. 11 is a cross-sectional view illustrating a configuration example of a sensor apparatus 100D according to embodiment 5 of the present disclosure. As illustrated in FIG. 11, in the sensor apparatus 100D, a magnetic shield pattern 130 (example of a conductor layer) is provided on the side of the lower surface 30b of the ceramic interposer substrate 30. The magnetic shield pattern 130 is provided on the side of the lower surface 30b of the ceramic interposer substrate 30 in such a manner as to surround a region opposed to the Peltier element 20 on the lower surface 30b of the ceramic interposer substrate 30. The magnetic shield pattern 130 is fixed at a given potential (e.g., ground voltage: 0V). In such a configuration, the magnetic shield pattern 130 can shield the Peltier element 20, thus suppressing noise generated by the Peltier element 20 from entering the sensor element 40.

Embodiment 6

In above embodiments 1 to 5, the sensor element 40 has been illustrated as an example of a "sensor element" of the present disclosure, and it has been described that the sensor element 40 is a CMOS image sensor or a CCD image sensor. However, the "sensor element" of the present disclosure is not limited to a CMOS image sensor or a CCD image sensor. Also, the material included in the photoelectric conversion layer of the "sensor element" of the present disclosure is not limited to silicon (Si) and may be a compound semiconductor.

Figure 12:
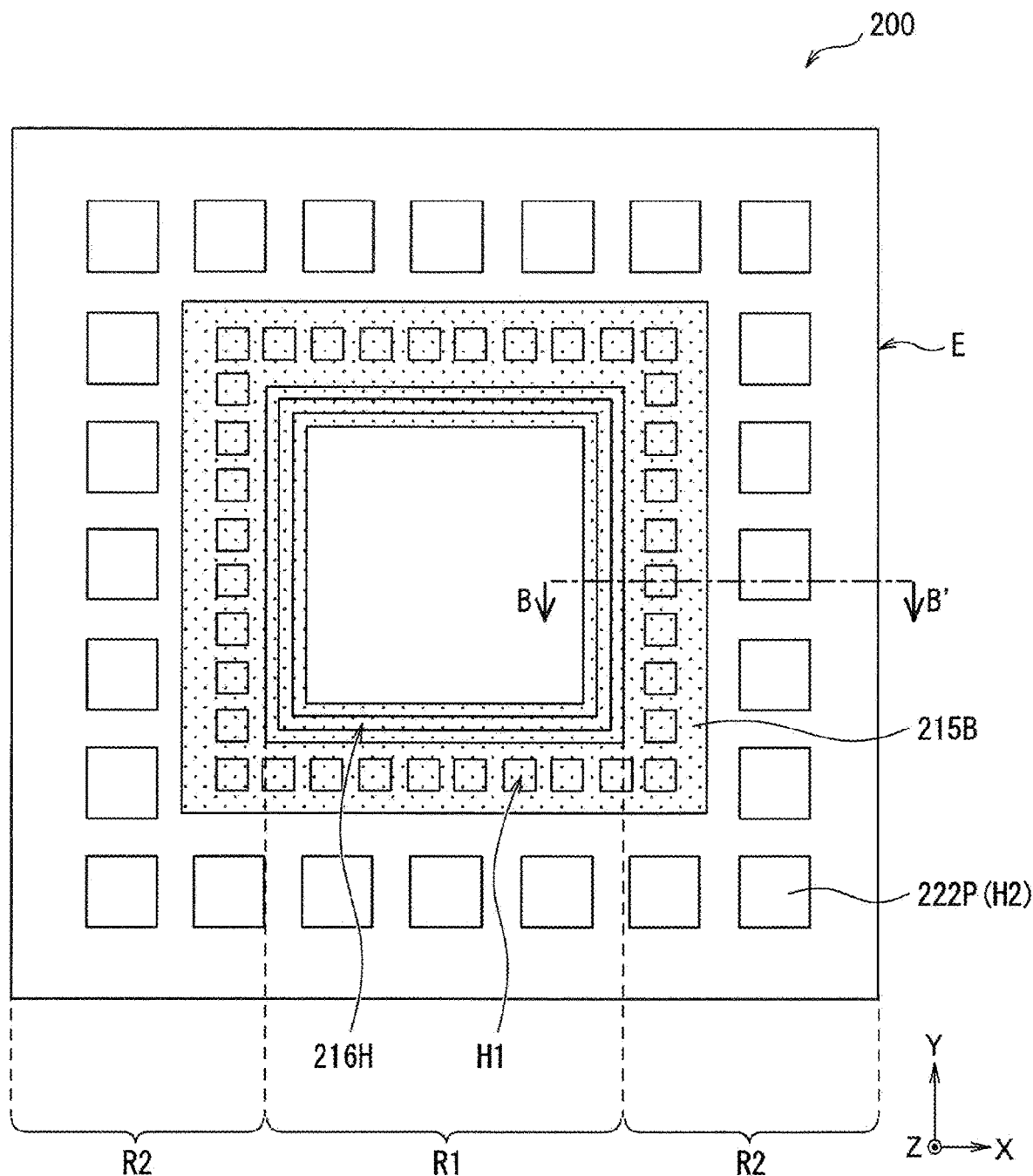
FIG. 12 is a plan view illustrating a configuration example of a sensor element according to embodiment 6 of the present disclosure.
Figure 13:
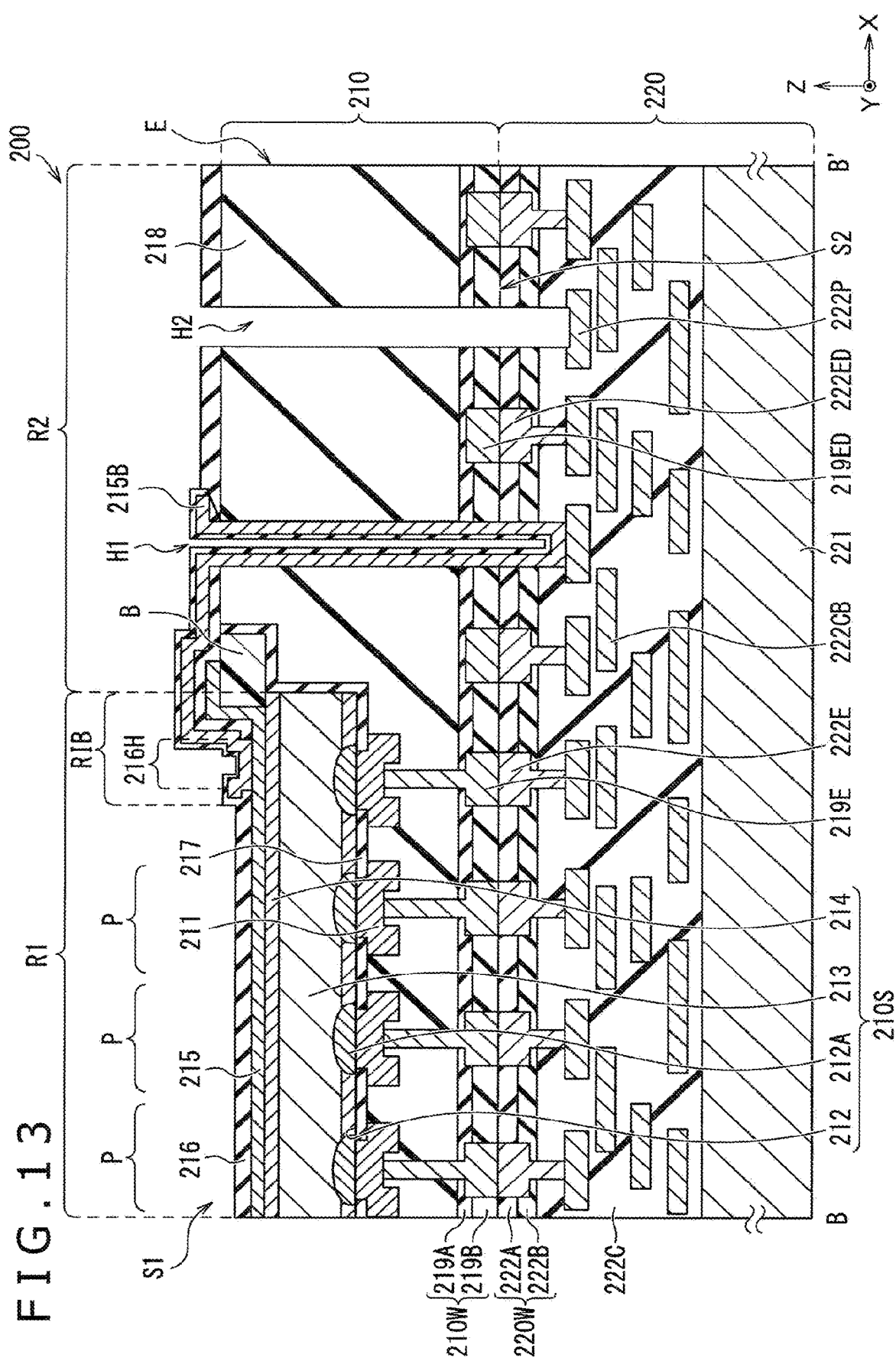
FIG. 13 is a cross-sectional view illustrating the configuration example of the sensor element according to embodiment 6 of the present disclosure.

For example, the "sensor element" of the present disclosure may be an InGaAs sensor whose photoelectric conversion layer includes a group III-V semiconductor such as InGaAs (indium-gallium-arsenide) and may be, for example, a sensor element 200 illustrated in FIGS. 12 and 13. Even in such a mode, it is possible to suppress the movement of foreign matters from the Peltier element 20 to the sensor element 200. A description will be given below of a configuration example of the sensor element 200.

FIGS. 12 and 13 are a plan view and a cross-sectional view illustrating a configuration example of the sensor element 200 according to embodiment 6 of the present disclosure. FIG. 12 illustrates a planar configuration of the sensor element 200, and FIG. 13 illustrates a cross-sectional configuration thereof along line B-B' in FIG. 12. The sensor element 200 is applied to, for example, an infrared sensor using a compound semiconductor material such as a group III-V semiconductor and has a function to photoelectrically convert light of a wavelength ranging from a visible region (e.g., 380 nm or more to less than 780 nm) to a short-infrared region (e.g., 780 nm or more to less than 2400 nm). In the sensor element 200, plural light reception unit regions p (pixels P) that are, for example, arranged two-dimensionally are provided (FIG. 13).

The sensor element 200 has an element region R1 in the center and a peripheral region R2 that is provided in the outside of the element region R1 and that surrounds the element region R1 (FIG. 12). The sensor element 200 has a conductive film 215B that is provided to span from the element region R1 to the peripheral region R2. The conductive film 215B has an opening in a region opposed to a center portion of the element region R1.

The sensor element 200 has a layered structure in which an element substrate 210 and a readout circuit substrate 220 are stacked (FIG. 13). One surface of the element substrate 210 is a light entry surface (light entry surface S1), and the surface on the opposite side of the light entry surface S1 (other surface) is a junction surface with the readout circuit substrate 220 (junction surface S2).

The element substrate 210 has a wiring layer 210W, first electrodes 211, a semiconductor layer 210S (first semiconductor layer), a second electrode 215, and a passivation film 216 in sequence from the position close to the readout circuit substrate 220. A surface of the semiconductor layer 210S, the surface being opposed to the wiring layer 210W, and an edge surface (side surface) thereof are covered with an insulating film 217. The readout circuit substrate 220 is what is called a ROIC (Readout integrated circuit) and has a wiring layer 220W, a multi-layer wiring layer 222C, and a semiconductor substrate 221. The wiring layer 220W is in contact with the junction surface S2 of the element substrate 210. The semiconductor substrate 221 is opposed to the element substrate 210 with the wiring layer 220W and the multi-layer wiring layer 222C therebetween.

The element substrate 210 has the semiconductor layer 210S in the element region R1. In other words, a region where the semiconductor layer 210S is provided is the element region R1 of the sensor element 200. Of the element region R1, a region exposed from the conductive film 215B (region opposed to the opening of the conductive film 215B) is a light reception region. Of the element region R1, a region covered with the conductive film 215B is an OPB (Optical Black) region R1B. The OPB region R1B is provided in such a manner as to surround the light reception region. The OPB region R1B is used to acquire a black level pixel signal.

The element substrate 210 has a filling-in layer 218 together with the insulating film 217 in the peripheral region R2. Holes H1 and H2 that penetrate the element substrate 210 and reach the readout circuit substrate 220 are provided in the peripheral region R2. In the sensor element 200, light enters the semiconductor layer 210S from the light entry surface S1 of the element substrate 210 via the passivation film 216, the second electrode 215, and a second contact layer 214. A signal charge acquired as a result of photoelectric conversion by the semiconductor layer 210S moves via the first electrodes 211 and the wiring layer 210W and is read out by the readout circuit substrate 220. A description will be given below of the configuration of each portion.

The wiring layer 210W is provided to span from the element region R1 to the peripheral region R2 and has the junction surface S2 with the readout circuit substrate 220. In the sensor element 200, the junction surface S2 of the element substrate 210 is provided in the element region R1 and the peripheral region R2, and, for example, the junction surface S2 of the element region R1 and the junction surface S2 of the peripheral region R2 form the same plane. In the sensor element 200, the junction surface S2 of the peripheral region R2 is formed as a result of the provision of the filling-in layer 218.

The wiring layer 210W has contact electrodes 219E and dummy electrodes 219ED, for example, inside interlayer insulating films 219A and 219B. For example, the interlayer insulating film 219B is provided on the side of the readout circuit substrate 220, and an interlayer insulating film 19A is provided on the side of a first contact layer 212, and the interlayer insulating films 219A and 219B are stacked one on top of another. The interlayer insulating films 219A and 219B each include, for example, an inorganic insulating material. Silicon nitride (SiN), aluminum oxide ($Al_2O_3$), silicon oxide ($SiO_2$), hafnium oxide ($HfO_2$), and the like are examples of this inorganic insulating material. The interlayer insulating films 219A and 219B may include the same inorganic insulating material.

The contact electrodes 219E are provided, for example, in the element region R1. The contact electrodes 219E are used to electrically connect the first electrodes 211 and the readout circuit substrate 220 and are each provided for each pixel P in the element region R1. The contact electrodes 219E adjacent to each other are electrically separated from each other by the filling-in layer 218 and the interlayer insulating films 219A and 219B. The contact electrodes 219E each include, for example, a copper (Cu) pad and are exposed on the junction surface S2. The dummy electrodes 219ED are provided, for example, in the peripheral region R2. The dummy electrodes 219ED are connected to dummy electrodes 222ED of the wiring layer 220W. By providing the dummy electrodes 219ED and the dummy electrodes 222ED, it is possible to improve strength of the peripheral region R2. The dummy electrodes 219ED are formed, for example, by the same process as that of the contact electrodes 219E. The dummy electrodes 219ED each include, for example, a copper (Cu) pad and are exposed on the junction surface S2.

The first electrodes 211 provided between the contact electrodes 219E and the semiconductor layer 210S are electrodes (anodes) to which a voltage for reading out a signal charge (holes or electrons; a description will be given hereinafter assuming that the signal charge is holes for reasons of convenience) generated by a photoelectric conversion layer 213 and are each provided for each pixel P in the element region R1. The first electrodes 211 are provided in such a manner as to fill in the openings of the insulating film 217 and are in contact with the semiconductor layer 210S (more specifically, a diffusion region 212A). The first electrodes 211 are, for example, larger than the openings of the insulating film 217, and part of the first electrodes 211 is provided in the filling-in layer 218. That is, an upper surface of the first electrodes 211 (the surface on the side of the semiconductor layer 210S) is in contact with the diffusion region 212A, and part of a lower surface and a side surface of the first electrodes 211 is in contact with the filling-in layer 218. The first electrodes 211 adjacent to each other are electrically separated from each other by the insulating film 217 and the filling-in layer 218.

The first electrodes 211 include, for example, any one of titanium (Ti), tungsten (W), titanium nitride (TiN), platinum (Pt), gold (Au), germanium (Ge), palladium (Pd), zinc (Zn), nickel (Ni), and aluminum (Al) or an alloy that includes at least one of them. The first electrodes 211 may be a single film of one of these materials or a layered film that includes a combination of two or more of these materials. For example, the first electrodes 211 include a layered film of titanium and tungsten. The first electrodes 211 are, for example, several tens to hundreds of nanometers in thickness.

The semiconductor layer 210S includes, for example, the first contact layer 212, the photoelectric conversion layer 213, and the second contact layer 214 from the position close to the wiring layer 210W. The first contact layer 212, the photoelectric conversion layer 213, and the second contact layer 214 have the same planar shape, and edge surfaces of the respective layers are arranged at the same position in plan view.

The first contact layer 212 is provided, for example, in common for all the pixels P and arranged between the insulating film 217 and the photoelectric conversion layer 213. The first contact layer 212 is used to electrically separate the pixels P adjacent to each other, and the plural diffusion regions 212A, for example, are provided in the first contact layer 212. By using, to form the first contact layer 212, a compound semiconductor material having a bandgap larger than that of the compound semiconductor material included in the photoelectric conversion layer 213, it is also possible to suppress dark current. For example, N-type InP (indium phosphide) can be used for the first contact layer 212.

The diffusion regions 212A provided in the first contact layer 212 are provided apart from each other. The diffusion regions 212A are each provided for each pixel P, and the first electrode 211 is connected to each of the diffusion regions 212A. The diffusion region 212A is also provided in the OPB region R1B. The diffusion regions 212A are used to read out the signal charge generated by the photoelectric conversion layer 213 for each pixel P and each include, for example, a P-type impurity. Zn (zinc) or the like is an example of a P-type impurity. As described above, a pn junction interface is formed between the diffusion region 212A and the first contact layer 212 other than the diffusion region 212A, to electrically separate the pixels P adjacent to each other. The diffusion regions 212A are provided, for example, in the direction of the thickness of the first contact layer 212 and also provided in part of the direction of the thickness of the photoelectric conversion layer 213.

The photoelectric conversion layer 213 between the first electrodes 211 and the second electrode 215, and more specifically, the photoelectric conversion layer 213 between the first contact layer 212 and the second contact layer 214, is provided, for example, in common for all the pixels P. The photoelectric conversion layer 213 generates a signal charge by absorbing light having a specific wavelength and includes, for example, a compound semiconductor material such as an i-type group III-V semiconductor. InGaAs (indium-gallium-arsenic), InAsSb (indium-arsenic-antimony), InAs (indium-arsenic), InSb (indium-antimony), HgCdTe (mercury-cadmium-tellurium), and the like are examples of a compound semiconductor material included in the photoelectric conversion layer 213. The photoelectric conversion layer 213 may include Ge (germanium). The photoelectric conversion layer 213 photoelectrically converts, for example, light of a wavelength ranging from the visible region to the short-infrared region.

The second contact layer 214 is provided, for example, in common for all the pixels P. The second contact layer 214 is provided between the photoelectric conversion layer 213 and the second electrode 215 and is in contact with them. The second contact layer 214 is a region where the charge emitted by the second electrode 215 moves and includes, for example, a compound semiconductor including an N-type impurity. N-type InP (indium phosphide), for example, can be used for the second contact layer 214.

The second electrode 215 is provided on the second contact layer 214 (light entry side) in such a manner as to be in contact with the second contact layer 214, for example, as a common electrode for each pixel P. The second electrode 215 is used to emit, of the charge generated by the photoelectric conversion layer 213, the charge that is not used as a signal charge (cathode). For example, in a case where holes are read out from the first electrodes 211 as a signal charge, electrons, for example, can be emitted through the second electrode 215. The second electrode 215 includes, for example, a conductive film that allows passage of incident light such as infrared rays. ITO (Indium Tin Oxide), ITiO ($In_2O_3$—$TiO_2$), or the like can be used, for example, for the second electrode 215. The second electrode 215 may be provided, for example, in a lattice pattern to partition the pixels P adjacent to each other. A conductive material having low light transmissivity can be used for the second electrode 215.

The passivation film 216 covers the second electrode 215 from the side of the light entry surface S1. The passivation film 216 may have an anti-reflection function. For example, silicon nitride (SiN), aluminum oxide ($Al_2O_3$), silicon oxide ($SiO_2$), tantalum oxide ($Ta_2O_3$), and the like can be used for the passivation film 216. The passivation film 216 has an opening 216H in the OPB region R1B. The opening 216H is provided in the shape of a picture frame surrounding the light reception region (FIG. 12). The opening 216H may be, for example, a rectangular or circular hole in plan view. The conductive film 215B is electrically connected to the second electrode 215 by the opening 216H of the passivation film 216.

The insulating film 217 is provided between the first contact layer 212 and the filling-in layer 218, covers the edge surface of the first contact layer 212, the edge surface of the photoelectric conversion layer 213, the edge surface of the second contact layer 214, and the edge surface of the second electrode 215, and is in contact with the passivation film 216 in the peripheral region R2. The insulating film 217 includes oxide such as silicon oxide ($SiO_x$) or aluminum oxide ($Al_2O_3$). The insulating film 217 may have a layered structure that includes plural films. The insulating film 217 may include a silicon-based insulating film such as silicon oxide nitride (SiON), silicon oxide including carbon (SiOC), silicon nitride (SiN), and silicon carbide (SiC). The insulating film 217 is, for example, several tens to hundreds of nanometers in thickness.

The conductive film 215B is provided to span from the OPB region R1B to a hole H1 in the peripheral region R2. The conductive film 215B is in contact with the second electrode 215 in the opening 216H of the passivation film 216 provided in the OPB region R1B and is in contact with a wiring 222CB of the readout circuit substrate 220 via the hole H1. This allows a voltage to be supplied to the second electrode 215 from the readout circuit substrate 220 via the conductive film 215B. The conductive film 215B not only functions as a voltage supply path to the second electrode 215 as described above but also has a function as a light-shielding film and forms the OPB region R1B. The conductive film 215B includes, for example, a metallic material that includes tungsten (W) aluminum (Al), titanium (Ti), molybdenum (Mo), tantalum (Ta), or copper (Cu). A passivation film may be provided on the conductive film 215B.

An adhesive layer B may be provided between the edge portion of the second contact layer 214 and the second electrode 215. The adhesive layer B is used to form the sensor element 200 and plays a role of joining the semiconductor layer 210S to a temporary substrate. The adhesive layer B includes, for example, tetraethoxysilane (TEOS), silicon oxide ($SiO_2$), or the like. The adhesive layer B is provided, for example, wider than the edge surface of the semiconductor layer 210S and is covered with the filling-in layer 218 together with the semiconductor layer 210S. The insulating film 217 is provided between the adhesive layer B and the filling-in layer 218.

Embodiment 7

Figure 14:
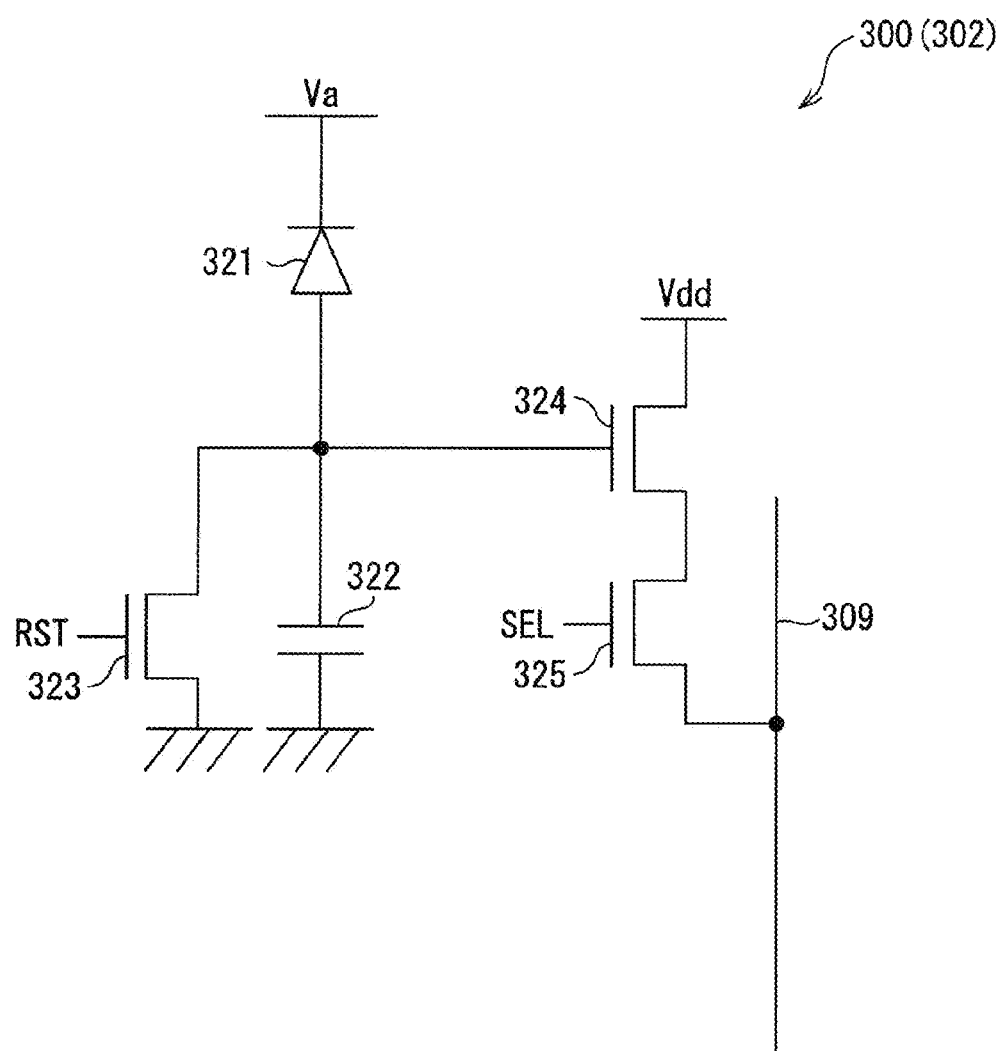
FIG. 14 is a circuit diagram illustrating a pixel circuit of each pixel of a sensor element according to embodiment 7 of the present disclosure.

The "sensor element" of the present disclosure may be a sensor element 300 illustrated in FIGS. 14 and 15. Even in such a mode, it is possible to suppress the movement of foreign matters from the Peltier element 20 (refer to FIG. 2) to the sensor element 300. A description will be given below of a configuration example of the sensor element 300.

FIG. 14 is a circuit diagram illustrating a pixel circuit of each pixel 302 of the sensor element 300 according to embodiment 7 of the present disclosure. FIG. 15 is a cross-sectional view illustrating a pixel structure of the sensor element 300 according to embodiment 7 of the present disclosure. A description will be given first of the pixel circuit illustrated in FIG. 14.

As illustrated in FIG. 14, each pixel 302 includes a photoelectric conversion section 321, a capacitive element 322, a reset transistor 323, an amplifying transistor 324, and a selection transistor 325. The photoelectric conversion section 321 includes a semiconductor thin film using a compound semiconductor such as InGaAs and generates a charge (signal charge) proportional to an amount of light received. A given bias voltage Va is applied to the photoelectric conversion section 321.

The capacitive element 322 stores the charge generated by the photoelectric conversion section 321. The capacitive element 322 can include, for example, at least one of P-N junction capacitance, MOS capacitance, or wiring capacitance. When the reset transistor 323 is turned ON by a reset signal RST, the charge stored in the capacitive element 322 is emitted to a source (ground), thus resetting a potential of the capacitive element 322.

The amplifying transistor 324 outputs a pixel signal proportional to the stored potential of the capacitive element 322. That is, the amplifying transistor 324 forms a source follower circuit with a load MOS (not illustrated) as a constant current source connected via a vertical signal line 309. The pixel signal indicating a level proportional to the charge stored in the capacitive element 322 is output from the amplifying transistor 324 to a signal processing circuit (not illustrated) via the selection transistor 325.

A description will be given next of the pixel structure illustrated in FIG. 15. It should be noted that each pixel 302 in a pixel array region can be classified into a normal pixel 302A and a charge ejection pixel 302B, depending on the difference in the manner of controlling the reset transistor 323. It should be noted, however, that the normal pixel 302A and the charge ejection pixel 302B have the same pixel structure. Accordingly, these pixels will be simply described as the pixels 302. It should be noted that the charge ejection pixel 302B is arranged at an outermost side of the pixel array region.

The readout circuit for the photoelectric conversion section 321, the capacitive element 322, the reset transistor 323, the amplifying transistor 324, and the selection transistor 325 of each pixel 302 illustrated in FIG. 14 is formed for each pixel in a semiconductor substrate 312 that includes a monocrystalline material such as monocrystalline silicon (Si). It should be noted that reference signs such as the capacitive element 322, the reset transistor 323, the amplifying transistor 324, and the selection transistor 325 illustrated in FIG. 14 are omitted in FIG. 15.

As illustrated in FIG. 15, an N-type semiconductor thin film 341 that will be the photoelectric conversion section 321 (refer to FIG. 14) is formed over the entire surface of the pixel array region on the upper side of the semiconductor substrate 312 which is the light entry side. InGaP, InAlP, InGaAs, and InAlAs may be used as the N-type semiconductor thin film 341, and a compound semiconductor having a chalcopyrite structure may also be used. The compound semiconductor having a chalcopyrite structure is a material that offers a high light absorption coefficient and high sensitivity over a wide wavelength range and is preferably used as the N-type semiconductor thin film 341 for photoelectric conversion. Such a compound semiconductor having a chalcopyrite structure includes elements around group IV elements such as Cu, Al, GaIn, S, and Se, and CuGaInS-based mixed crystal, CuAlGaInS-based mixed crystal, CuAlGaInSSe-based mixed crystal, and the like are examples thereof.

Also, in addition to the compound semiconductor described above, amorphous silicon (Si), germanium (Ge), a quantum-dot photoelectric conversion film, an organic photoelectric conversion film, and the like can also be used as the material of the N-type semiconductor thin film 341. In the present embodiment, it is assumed that an InGaAs compound semiconductor is used as the N-type semiconductor thin film 341.

A high-concentration P-type layer 342 included in a pixel electrode is formed for each pixel on the lower side of the N-type semiconductor thin film 341, the lower side being the side of the semiconductor substrate 312. Then, an N-type layer 343 as a pixel separation region for separating the pixels 302 is formed between the high-concentration P-type layers 342 that are each formed for each pixel. The N-type layers 343 are each formed by using, for example, a compound semiconductor such as InP. The N-type layers 343 play a role of preventing dark current in addition to their function as the pixel separation region.

Meanwhile, a high-concentration N-type layer 344 having higher concentration than the N-type semiconductor thin film 341 is formed on the upper side of the N-type semiconductor thin film 341, the upper side being the light entry side. The high-concentration N-type layer 344 is formed by using the compound semiconductor such as InP that is used as the pixel separation region. The high-concentration N-type layer 344 functions as a barrier layer for preventing a charge generated by the N-type semiconductor thin film 341 from flowing in reverse. A compound semiconductor such as InGaAs, InP, and InAlAs can be used as the material of the high-concentration N-type layer 344, for example.

An anti-reflection film 45 is formed on the high-concentration N-type layer 344 being as the barrier layer. Silicon nitride (SiN), hafnium oxide ($HfO_2$), aluminum oxide ($Al_2O_3$), zirconium oxide ($ZrO_2$), tantalum oxide ($Ta_2O_5$), titanium oxide (TiO$_2$), and the like can be used as the material of an anti-reflection film 345, for example.

Any one of the high-concentration N-type layer 344 or the anti-reflection film 345 also functions as an upper electrode of the two electrodes that vertically sandwich the N-type semiconductor thin film 341, and the given voltage Va is applied to the high-concentration N-type layer 344 or the anti-reflection film 345 as the upper electrode.

Color filters 346 and an on-chip lens 347 are further formed on the anti-reflection film 345. The color filters 346 allow passage of any one of R (red), G (green), or B (blue) light (wavelength light) and are arranged, for example, in what is called a Bayer pattern in the pixel array region.

A passivation layer 351 and an insulating layer 352 are formed on the lower side of the N-type layer 343 being as the pixel separation region and of the high-concentration N-type layer 344 included in the pixel electrode. Then, connection electrodes 353A and 353B and a bump electrode 354 are formed in such a manner as to penetrate the passivation layer 351 and the insulating layer 352. The connection electrodes 353A and 353B and the bump electrode 354 electrically connect the high-concentration P-type layer 342 included in the pixel electrode and the capacitive element 322 that stores the charge.

Other Embodiments

As described above, the present disclosure has been described by using the embodiments and modification examples. However, the statement and the drawings which are part of this disclosure should not be construed as limiting the present disclosure. Various alternative embodiments, working examples, and operational technologies will become apparent to a person skilled in the art from this disclosure. In the embodiments of the present disclosure, for example, a heatsink may be attached to the package substrate 10 to improve heat radiation of the Peltier element 20 to the package substrate 10. A region that is on the side of the lower surface 10b of the package substrate 10 and that is opposed to the Peltier element 20 is an example of a region where the heatsink is attached.

As described above, it is a matter of course that the present technology includes various embodiments and the like not described herein. At least one of various omissions, substitutions, and alterations can be made to components without departing from the gist of the embodiments and modification examples described above. Also, advantageous effects described in the present specification are merely illustrative and not restrictive, and there may be additional advantageous effects.

It should be noted that the present disclosure can also have the following configurations.

(1)
A sensor apparatus including:
a package substrate having a recess portion on a side of a first surface and plural terminals on a side of a second surface located on an opposite side of the first surface;
a Peltier element arranged in the recess portion;
a circuit substrate arranged on an opposite side of a bottom surface of the recess portion with the Peltier element sandwiched therebetween; and
a sensor element attached to an opposite side of a surface of the circuit substrate, the surface being opposed to the Peltier element.

(2)
The sensor apparatus of feature (1), further including:
a lid that is attached to the package substrate and covers the circuit substrate and the sensor element, in which
a space between the lid and the package substrate is sealed airtight.

(3)
The sensor apparatus of feature (2), in which
the lid is attached to the package substrate by seam welding.

(4)
The sensor apparatus of any one of features (1) to (3), in which
a space around the Peltier element is separated from a space around the sensor element by the circuit substrate and an inner side surface of the recess portion.

(5)
The sensor apparatus of any one of features (1) to (3), further including:
a casing that is arranged in the recess portion and accommodates the Peltier element, in which
a space around the Peltier element is separated from a space around the sensor element by the casing.

(6)
The sensor apparatus of feature (5), in which
the casing is metallic.

(7)
The sensor apparatus of any one of features (1) to (3), further including:
a wall member that is sandwiched between the bottom surface of the recess portion and the circuit substrate and laterally surrounds the Peltier element, in which
a space around the Peltier element is separated from a space around the sensor element by the circuit substrate and the wall member.

(8)
The sensor apparatus of any one of features (1) to (5) and (7), in which
the circuit substrate has a conductor layer provided in such a manner as to surround a region opposed to the Peltier element.

(9)
The sensor apparatus of any one of features (1) to (8), in which
the sensor element has a photoelectric conversion layer that includes silicon.

(10)
The sensor apparatus of any one of features (1) to (8), in which
the sensor element has a photoelectric conversion layer that includes a compound semiconductor.

REFERENCE SIGNS LIST

10: Package substrate
10a, 25a, 30a, 40a: Upper surface
10b, 30b, 40b, 62b: Lower surface
11: Cavity
12, 13: Pin-shaped terminal
14: Bonding pad
15: Seal ring
20: Peltier element
21: First ceramic substrate
22: First copper electrode
25: Second ceramic substrate
26: Second copper electrode
27: P-type thermoelectric semiconductor 28: N-type thermoelectric semiconductor
30: Ceramic interposer substrate
30e: Edge portion
31: Bonding pad
40, 200, 300: Sensor element
41: Bonding pad
50: Sensor assembly package
50a: Upper surface
51: Adhesive
54, 55: Wire
60: Seal-glass-equipped lid
61b: Lower surface
62: Ceramic frame
63: Metallic portion
100, 100A, 100B, 100C, 100D: Sensor apparatus
110: Casing
111: First recess portion
111a, 112a: Bottom surface
112: Second recess portion
112c: Inner side surface
120: Wall member
130: Magnetic shield pattern
210: Element substrate
210S: Semiconductor layer
210W: Wiring layer
211: First electrodes
212: First contact layer
212A: Diffusion region
213: Photoelectric conversion layer
214: Second contact layer
215: Second electrode
215B: Conductive film
216: Passivation film
216H: Opening
217: Insulating film
218: Filling-in layer
219A, 219B: Interlayer insulating film
219E: Contact electrode
219ED: Dummy electrode
220: Readout circuit substrate
220W: Wiring layer
221: Semiconductor substrate
222C: Multi-layer wiring layer
222CB: Wiring
222ED: Dummy electrode
302: Pixels
302A: Normal pixel
302B: Charge ejection pixel
309: Vertical signal line
312: Semiconductor substrate
321: Photoelectric conversion section
322: Capacitive element
323: Reset transistor
324: Amplifying transistor
325: Selection transistor
341: Semiconductor thin film
342: P-type layer
343, 344: N-type layer
345: Anti-reflection film
346: Color filter
347: On-chip lens
351: Passivation layer
352: Insulating layer
353A, 353B: Connection electrode
354: Bump electrode

The invention claimed is:

1. A sensor apparatus, comprising:
a package substrate that includes:
a first recess portion on a first side of a first surface of the package substrate;
a second recess portion on a bottom surface of the first recess portion; and
a plurality of terminals on a second side of a second surface of the package substrate, wherein the second side is opposite to the first side;
a Peltier element in the second recess portion;
a circuit substrate on an opposite side of a bottom surface of the second recess portion, wherein
the Peltier element is between a bottom surface of the circuit substrate and the bottom surface of the second recess portion,
the bottom surface of the circuit substrate is attached to the bottom surface of the first recess portion, and
the bottom surface of the circuit substrate faces the Peltier element; and
an image sensor on an upper surface of the circuit substrate, wherein
the circuit substrate is different from the image sensor, and
the upper surface of the circuit substrate is opposite to the bottom surface of the circuit substrate.

2. The sensor apparatus according to claim 1, further comprising:
a lid attached to the package substrate; and
a sealed airtight space between the lid and the package substrate, wherein the lid is configured to cover the circuit substrate and the image sensor.

3. The sensor apparatus according to claim 2, wherein the lid is seam welded to the package substrate.

4. The sensor apparatus according to claim 1, wherein the circuit substrate and an inner side surface of the second recess portion separate a space around the Peltier element from a space around the image sensor.

5. The sensor apparatus according to claim 1, further comprising a casing in the second recess portion, wherein
the casing accommodates the Peltier element, and
the casing separates a space around the Peltier element from a space around the image sensor.

6. The sensor apparatus according to claim 5, wherein the casing includes a metal.

7. The sensor apparatus according to claim 1, further comprising a wall member between the circuit substrate and the bottom surface of the second recess portion, wherein
the wall member laterally surrounds the Peltier element, and
the circuit substrate and the wall member separate a space around the Peltier element from a space around the image sensor.

8. The sensor apparatus according to claim 1, wherein
the bottom surface of the circuit substrate includes a conductor layer, and
the conductor layer surrounds a region opposed to the Peltier element.

9. The sensor apparatus according to claim 1, wherein the image sensor has a photoelectric conversion layer that includes silicon.

10. The sensor apparatus according to claim 1, wherein the image sensor has a photoelectric conversion layer that includes a compound semiconductor.

* * * * *